(12) United States Patent
Jung et al.

(10) Patent No.: US 11,816,447 B2
(45) Date of Patent: Nov. 14, 2023

(54) METHOD AND APPARATUS PERFORMING OPERATIONS USING CIRCUITS

(71) Applicant: Samsung Electronics Co., Ltd., Suwon-si (KR)

(72) Inventors: Seungchul Jung, Suwon-si (KR); Sungmeen Myung, Suwon-si (KR); Sangjoon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 183 days.

(21) Appl. No.: 17/093,889

(22) Filed: Nov. 10, 2020

(65) Prior Publication Data

US 2021/0405967 A1    Dec. 30, 2021

(30) Foreign Application Priority Data

Jun. 24, 2020    (KR) ........................ 10-2020-0077377

(51) Int. Cl.
     *G06F 7/544*      (2006.01)
     *G01R 19/165*      (2006.01)
     (Continued)

(52) U.S. Cl.
     CPC ..... *G06F 7/5443* (2013.01); *G01R 19/16538* (2013.01); *G01R 27/02* (2013.01);
     (Continued)

(58) Field of Classification Search
     CPC ..... G11C 27/02; G11C 27/022; G11C 27/024; G11C 27/026; G11C 27/028
     (Continued)

(56) References Cited

U.S. PATENT DOCUMENTS 8,013,772 B2 *    9/2011    Li .......................... H03M 1/785
                                                                                          341/154
8,829,915 B2      9/2014    Nishida et al.
(Continued)

FOREIGN PATENT DOCUMENTS

| JP | 2013-195136 A | 9/2013 |
|---|---|---|
| JP | 2017-142269 A | 8/2017 |
| WO | WO 2020/075272 A1 | 4/2020 |

OTHER PUBLICATIONS

Bavandpour, Mohammad. "Toward Efficient Mixed-Signal Neural Processors Using Non-Volatile Memory Devices" *University of California, Santa Barbara*, Mar. 1, 2020, pp. 21-27 (7 pages in English).

(Continued)

*Primary Examiner* — Quan Tra
(74) *Attorney, Agent, or Firm* — NSIP Law

(57) ABSTRACT

A method of performing a predetermined operation for a circuit that includes a resistor group, one end of the resistor group being configured for connection to a power supply unit, the other end of the resistor group being configured for connection to a sampling capacitor, and a parasitic capacitance existing at each node between resistors of the resistor group. The method includes in a forward process, determining a time when a sampling capacitor voltage applied to the sampling capacitor reaches a first reference voltage as a switching time; at the switching time, connecting the sampling capacitor to a ground or predetermined voltage and floating the power supply unit; in a backward process, after the switching time, determining a time when a power supply unit voltage applied to the power supply unit reaches a second reference voltage as an end time; and performing the predetermined operation based on the end time.

9 Claims, 15 Drawing Sheets

(51) Int. Cl.
  *G01R 27/02* (2006.01)
  *G04F 10/00* (2006.01)
  *G06N 3/08* (2023.01)
  *H03K 5/24* (2006.01)
(52) U.S. Cl.
  CPC ............ *G04F 10/005* (2013.01); *G06N 3/08* (2013.01); *H03K 5/24* (2013.01)
(58) Field of Classification Search
  USPC .............................................. 327/91, 94, 77
  See application file for complete search history.

(56) References Cited

U.S. PATENT DOCUMENTS

| | | |
|---|---|---|
| 9,355,721 B2* | 5/2016 | Yoon .................. G11C 13/0069 |
| 10,416,224 B2 | 9/2019 | Tamida et al. |
| 2008/0008330 A1* | 1/2008 | Tseng ..................... H04R 3/007 381/59 |
| 2015/0206586 A1 | 7/2015 | Chang et al. |
| 2015/0377856 A1 | 12/2015 | Dunbar et al. |
| 2019/0034201 A1* | 1/2019 | Muralimanohar ........ G06J 1/00 |
| 2021/0064367 A1 | 3/2021 | Kim et al. |
| 2021/0271452 A1* | 9/2021 | Yamagishi .............. G06F 17/10 |
| 2022/0100470 A1* | 3/2022 | Yoshida .................... G06F 7/50 |

OTHER PUBLICATIONS

Extended European Search Report dated Jul. 20, 2021 in counterpart European Patent Application No. 21156290.5 (26 pages in English).

* cited by examiner

METHOD AND APPARATUS PERFORMING OPERATIONS USING CIRCUITS

CROSS-REFERENCE TO RELATED APPLICATION

This application claims the benefit of Korean Patent Application No. 10-2020-0077377, filed on Jun. 24, 2020, in the Korean Intellectual Property Office, the disclosure of which is incorporated herein in its entirety by reference.

BACKGROUND

1. Field

The present disclosure relates to a method and apparatus performing operations using circuits.

2. Description of Related Art

Multiply-accumulate (MAC) operations influence the performance of applications in various fields, for example, in machine learning where multiple layers of MAC operations may be performed.

Input signals may form an input vector and may be data for an image, a byte stream, or another data set. The input signals are multiplied by a matrix of values or weights. Output signals are a result of the MAC operations on the input signals and a corresponding output vector. The output vector may be provided as an input vector for a next layer of the MAC operations and the process may be repeated for many layers.

Due to a large number of MAC operations being performed, the performance of applications is influenced by the performance of the MAC operations. Accordingly, it is desirable to efficiently and reliably perform the MAC operations at low power and at high speed.

A parasitic capacitance exists in a circuit that performs a MAC operation, which may result in an erroneous MAC operation result. Accordingly, there is a desire for research to reduce errors in operation results due to parasitic capacitances.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of performing a predetermined operation for a circuit that includes a resistor group including a plurality of resistors that are connected in series, one end of the resistor group being configured for connection to a power supply unit, the other end of the resistor group being configured for connection to a sampling capacitor, and a parasitic capacitance existing at each node between the plurality of resistors. The method includes in a forward process, determining a time when a sampling capacitor voltage applied to the sampling capacitor reaches a first reference voltage as a switching time; at the switching time, connecting the sampling capacitor to a ground or predetermined voltage and floating the power supply unit; in a backward process, after the switching time, determining a time when a power supply unit voltage applied to the power supply unit reaches a second reference voltage as an end time; and performing the predetermined operation based on the end time.

The first reference voltage may be reduced by a predetermined percentage ratio from a direct current (DC) voltage supplied to the power supply unit, and the second reference voltage may be reduced by 100 minus the predetermined percentage ratio from the DC voltage supplied to the power supply unit.

The predetermined operation may include a multiply-accumulate (MAC) operation or calculating a total resistance value of the resistor group, based on the end time.

Weighted inputs transmitted between nodes of a neural network may be determined by the MAC operation.

A non-transitory computer-readable storage medium storing instructions that, when executed by one or more processors, may configure the one or more processors to perform the method.

In another general aspect, a method of performing a predetermined operation for a circuit that includes a resistor group including a plurality of resistors that are connected in series, one end of the resistor group being configured for connection to a power supply unit, the other end of the resistor group being configured for connection to a sampling capacitor, a parasitic capacitance existing at each node between the plurality of resistors, the resistor group being divided into a first resistor group and a second resistor group, the first resistor group and the second resistor group being connected in parallel to each other, and a resistor arrangement order of the first resistor group being opposite to a resistor arrangement order of the second resistor group. The method includes determining a time when a sampling capacitor voltage applied to the sampling capacitor reaches a reference voltage as an end time, and performing the predetermined operation based on the end time.

The reference voltage may be reduced by a predetermined percentage ratio from a direct current (DC) voltage supplied to the power supply unit.

The predetermined operation includes a multiply-accumulate (MAC) operation or calculating a total resistance value of the resistor group, based on the end time.

Weighted inputs transmitted between nodes of a neural network may be determined by the MAC operation.

A non-transitory computer-readable storage medium storing instructions that, when executed by one or more processors, may configure the one or more processors to perform the method.

In another general aspect, an apparatus for performing a predetermined operation for a circuit, the apparatus includes a power supply unit connected to one end of the circuit, a resistor group, a sampling capacitor, a parasitic capacitance, a first comparator, one or more processors, and a second comparator. The resistor group includes a plurality of resistors connected in series between one end of the circuit and another end of the circuit. The sampling capacitor is connected in series to the plurality of resistors. The parasitic capacitance exists at each node between the plurality of resistors. The first comparator is configured to, in a forward process, compare a sampling capacitor voltage applied to the sampling capacitor with a first reference voltage and output first time information of a time when the sampling capacitor voltage reaches the first reference voltage. The one or more processors are configured to connect the sampling capacitor to a ground or predetermined voltage and float the power supply unit when the first time information is output. The second comparator is configured to, in a backward process subsequent to the first time information being output, compare a power supply unit voltage applied to the power supply unit with a second reference voltage and output second time information of a time when the power supply unit voltage reaches the second reference voltage. The one or more processors are further configured to perform the predetermined operation based on the second time information.

The first reference voltage may be reduced by a predetermined percentage ratio from a direct current (DC) voltage supplied to the power supply unit, and the second reference voltage may be reduced by 100 minus the predetermined percentage ratio from the DC voltage supplied to the power supply unit.

The predetermined operation may be a multiply-accumulate (MAC) operation or calculation of a total resistance value of the resistor group, based on the second time information.

Weighted inputs transmitted between nodes of a neural network may be determined by the MAC operation.

In another general aspect, an apparatus including a circuit for performing a predetermined operation, the apparatus includes a power supply unit, a resistor group, a sampling capacitor, a parasitic capacitance, a comparator, and one or more processors. The power supply unit is connected to one end of a circuit. The resistor group includes a plurality of resistors connected in series between one end of the circuit and another end of the circuit. The sampling capacitor is connected in series to the plurality of resistors. The parasitic capacitance exists at each node between the plurality of resistors. The comparator is configured to compare a sampling capacitor voltage applied to the sampling capacitor with a reference voltage and output time information of when the sampling capacitor voltage reaches the reference voltage. The one or more processors are configured to perform the predetermined operation based on the time information. The resistor group is divided into a first resistor group and a second resistor group, the first resistor group and the second resistor group are connected in parallel to each other, and a resistor arrangement order of the first resistor group is opposite to a resistor arrangement order of the second resistor group.

The reference voltage may be reduced by a predetermined percentage ratio from a direct current (DC) voltage supplied to the power supply unit.

The predetermined operation may be a multiply-accumulate (MAC) operation or calculation of a total resistance value of the resistor group, based on the time information.

Weighted inputs transmitted between nodes of a neural network is determined by predetermined operation.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
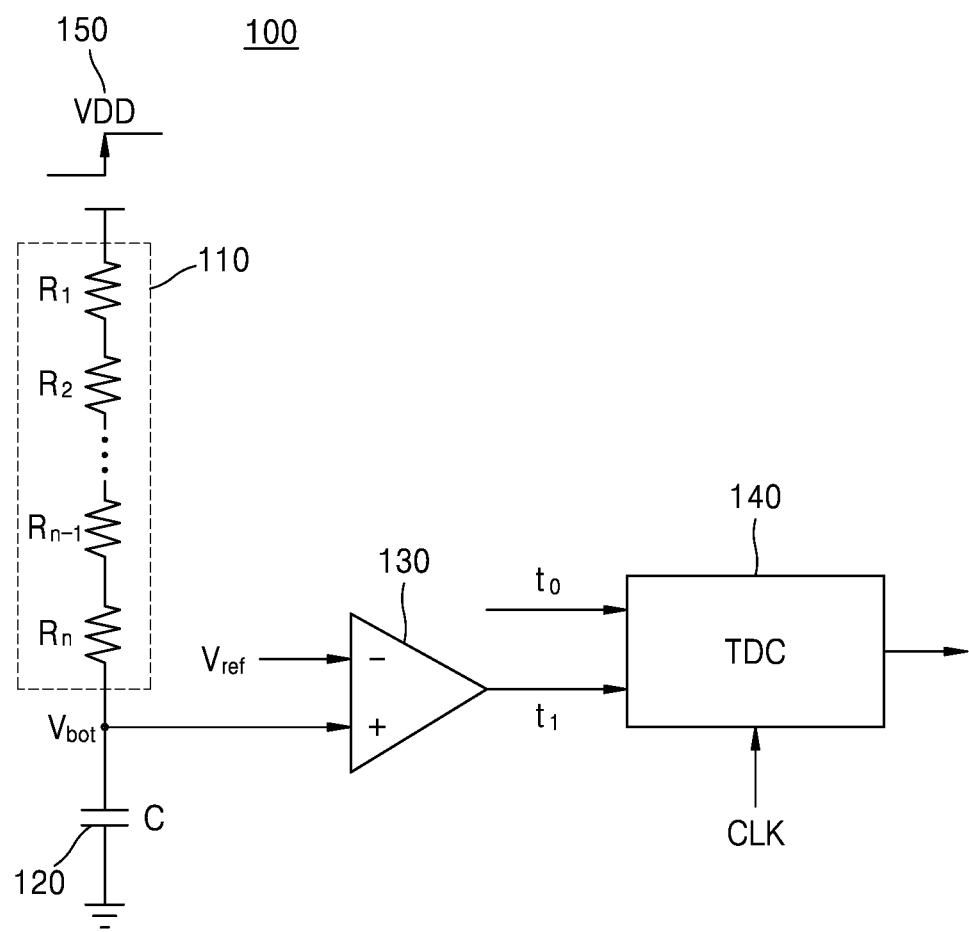
FIG. 1 is a diagram illustrating a circuit for performing a predetermined operation according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a predetermined order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating a circuit for performing a predetermined operation according to one or more embodiments.

In FIG. 1, a circuit 100 may include a resistor group 110 and a sampling capacitor 120.

The resistor group 110 may include a plurality of resistors that are connected in series. One end of the resistor group 110 may be connected to a power supply unit 150, and the other end of the resistor group 110 may be connected to the sampling capacitor 120.

Each of the plurality of resistors included in the resistor group 110 may be a resistive memory device. The resistive memory device may switch between different resistance states based on a voltage or current applied to both ends and may have a single or multi-layer structure, including any of the various materials: a transition metal oxide, a metal oxide such as a perovskite-based material, a phase change material such as a chalcogenide-based material, a ferroelectric material, or a ferromagnetic material. An operation in which the resistive memory device switches from a high resistance state to a low resistance state may be referred to as a set operation, and an operation in which the resistive memory device switches from a low resistance state to a high resistance state may be referred to as a reset operation.

A specific example in which each of the plurality of resistors included in the resistor group 110 operates as a resistive memory device will be further described below with reference to FIG. 2.

The sampling capacitor 120 may be connected in series to the plurality of resistors included in the resistor group 110. As a direct current (DC) voltage is applied to the power supply unit 150, the sampling capacitor 120 may become charged. A sampling capacitor voltage $V_{bot}$, corresponding to the amount of an electric charge charged in the sampling capacitor 120, may change over time based on a time constant determined by the total resistance value of the resistor group 110 and a capacitance of the sampling capacitor 120.

In further detail, the sampling capacitor voltage $V_{bot}$ varying with time may be expressed using Equation 1. In Equation 1, VDD denotes a DC voltage applied to the power supply unit 150, $C_S$ denotes a capacitance of the sampling capacitor 120, and $R_i$ denotes the plurality of resistors included in the resistor group 110.

$$V_{bot} = VDD * \left(1 - e^{-\frac{t}{\tau_{ideal}}}\right) \quad \text{Equation 1}$$

$$\tau_{ideal} = C_s \sum R_i$$

In one or more embodiments, the circuit 100 may further include a comparator 130. The comparator 130 may include an operational (OP) amplifier. One input node of the comparator 130 may receive the sampling capacitor voltage $V_{bot}$, and another input node of the comparator 130 may receive a reference voltage $V_{ref}$.

The comparator 130 may compare the sampling capacitor voltage $V_{bot}$, corresponding to the amount of an electric charge charged in the sampling capacitor 120, with the reference voltage $V_{ref}$, and may then output a comparison result.

For example, in a state where the sampling capacitor 120 is charged, the comparator 130 may compare the sampling capacitor voltage $V_{bot}$ with the reference voltage $V_{ref}$, and may generate an output signal when the sampling capacitor voltage $V_{bot}$ reaches the reference voltage $V_{ref}$. The output signal of the comparator 130 may be transmitted to a time-to-digital converter (TDC) 140.

The TDC 140 may convert the time taken from a reference time $t_0$ to an end time $t_1$, when the output signal from the comparator 130 is received by the TDC 140 into a digital value, and may output the digital value.

A predetermined operation may be performed based on the digital value output from the TDC 140. In one or more embodiments, an operation result may be a multiply-accumulate (MAC) result. In another embodiment, the operation result may be a total resistance value of the circuit 900.

Figure 2:
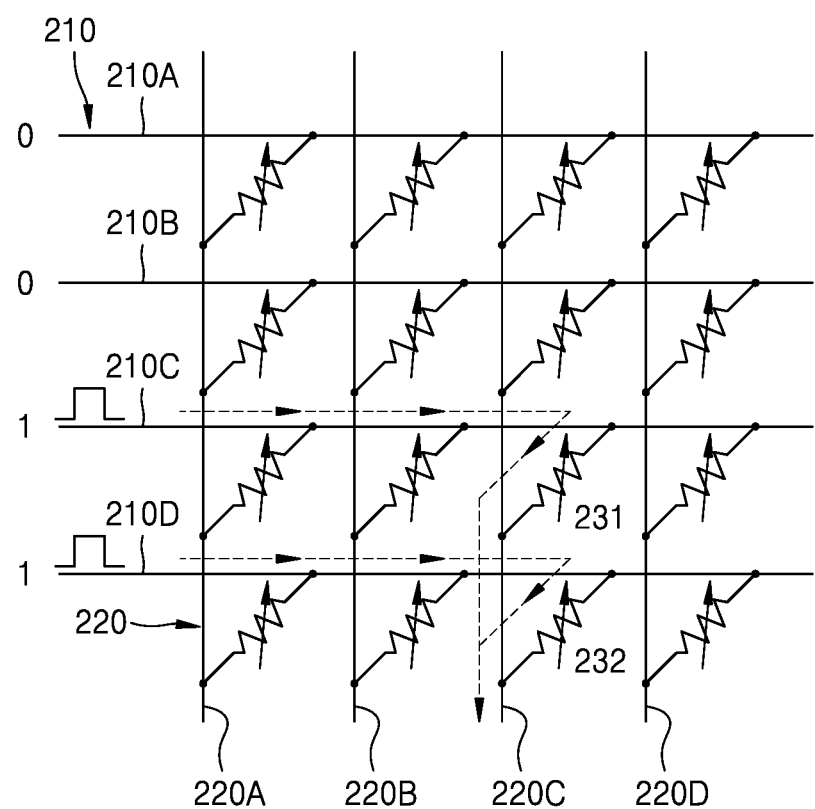
FIG. 2 is a diagram for describing an example of performing a multiply-accumulate (MAC) operation using a resistive memory device according to one or more embodiments.

FIG. 2 is a diagram for describing an example of performing a MAC operation using a resistive memory device according to one or more embodiments.

In FIG. 2, each of a plurality of resistors may operate as a resistive memory device.

In an initial state, all of the plurality of resistors may be in a relatively low conductivity state, that is, a high resistance state. When, at least, some of the plurality of resistors are in a low resistance state, an initialization operation for switching the resistors to a high resistance state may be additionally required.

Each of the plurality of resistors may have a predetermined threshold value required to change its resistance value and/or conductivity. In more detail, when a voltage or current whose magnitude is less than a predetermined threshold value is applied to both ends of each of the plurality of resistors, the conductivity of each of the plurality of resistors may not be changed, and contrarily, when a voltage or current whose magnitude is greater than the predetermined threshold value is applied to each of the plurality of resistors, the conductivity of each of the plurality of resistors may be changed.

In this state, in order to perform an operation of outputting specific data as a result of a column wiring 220, an input signal corresponding to the specific data may be applied to a row wiring 210. In this case, the input signal may be applied as an electrical pulse to the row wiring 210. For example, when an input signal corresponding to data '0011' is applied to the row wiring 210, an electrical pulse may not be applied to the row wiring 210 corresponding to '0', for example, first and second row wirings 210A and 210B, and an electrical pulse may be applied only to the row wiring 210 corresponding to '1', for example, third and fourth row wirings 210C and 210D. In this case, the column wiring 220 may be driven with an appropriate voltage or current to output a result.

For example, when the column wiring 220 for outputting the specific data is already determined, some column wirings of the column wiring 220 may be driven so that a plurality of resistors located at intersections with the row wiring 210 corresponding to '1' receive a voltage whose magnitude is equal to or greater than a voltage (hereinafter, referred to as a set voltage) required during a set operation, and remaining column wirings of the column wiring 220 may be driven so that remaining resistors receive a voltage whose magnitude is less than the set voltage.

For example, when a magnitude of the set voltage is Vset and a third column wiring 220C is determined as the column wiring 220 for outputting the data '0011', a magnitude of an electrical pulse applied to the third and fourth row wirings 210C and 210D may be equal to or greater than the set voltage Vset and a voltage applied to the third column wiring 220C may be 0 V so that first and second synapses 231 and 232 located at intersections between the third column wiring 220C and the third and fourth row wirings 210C and 210D receive a voltage equal to or greater than the set voltage Vset. Accordingly, the first and second synapses 231 and 232 may be in a low resistance state.

Conductivities of the first and second synapses 231 and 232 in the low resistance state may gradually increase as the number of electrical pulses increases. Magnitudes and widths of applied electrical pulses may be substantially constant. A voltage applied to remaining column wirings, that is, first, second, and fourth column wirings 220A, 220B, and 220D, may have a value between 0 V and the set voltage Vset, (e.g., ½Vset), so that remaining resistors other than the first and second synapses 231 and 232 receive a voltage less than the set voltage Vset. Accordingly, resistance states of the remaining resistors other than the first and second synapses 231 and 232 may not be changed. The flow of current or electrons in this case is indicated by a dashed arrow.

Figure 3:
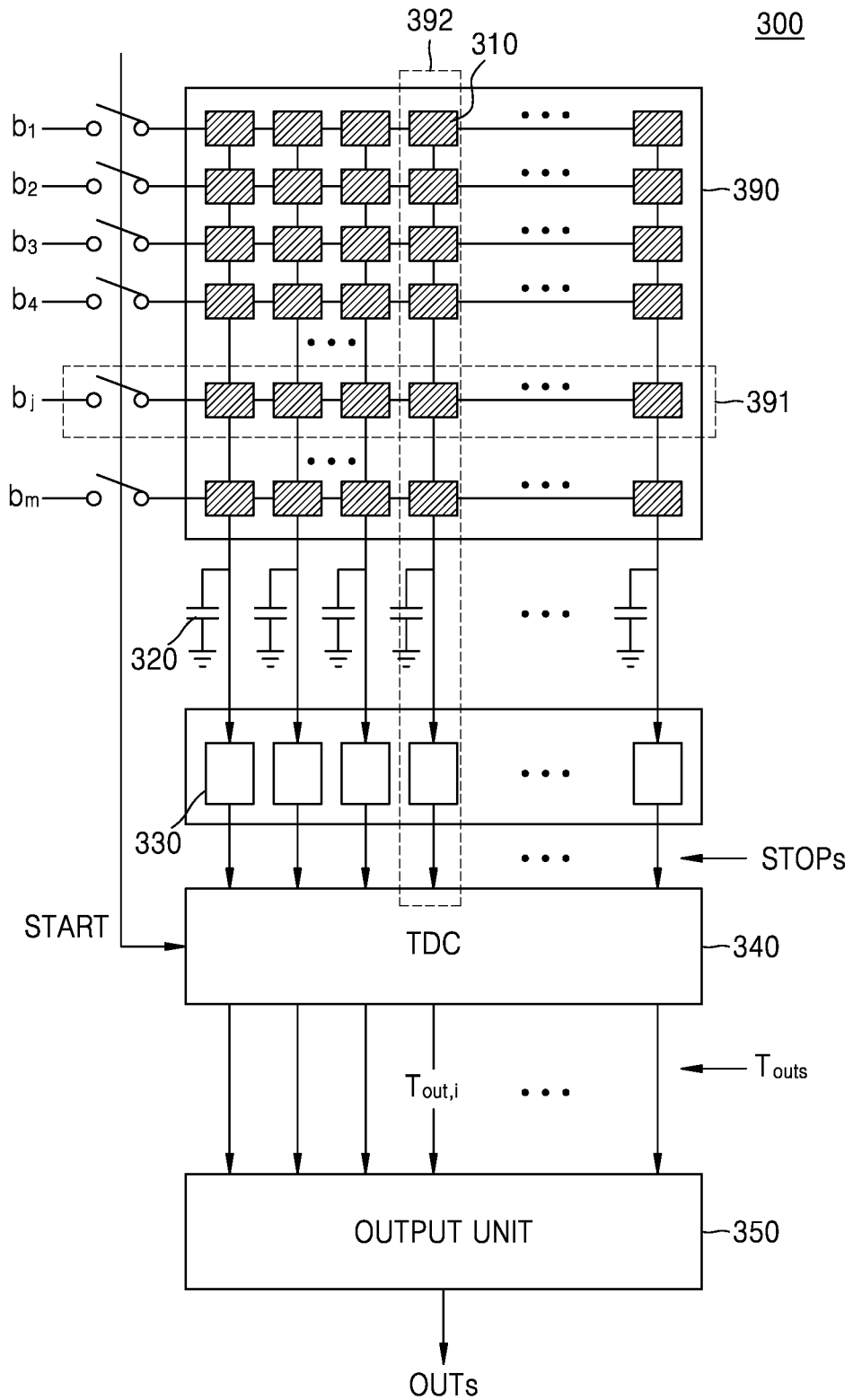
FIG. 3 is a diagram describing a MAC circuit including a plurality of input lines and a plurality of output lines according to one or more embodiments.

FIG. 3 is a diagram describing a MAC circuit including a plurality of input lines and a plurality of output lines according to one or more embodiments.

A MAC circuit 300, according to one or more embodiments, may include a plurality of input lines capable of individually receiving an input signal and a plurality of output lines capable of individually outputting an output signal. Each of the plurality of output lines may include a plurality of resistors, a sampling capacitor 320, and a comparator 330. Each of the plurality of input lines intersects a plurality of output lines.

The MAC circuit 300 of FIG. 3 may include m input lines and n output lines. The MAC circuit 300 may include a plurality of resistors, a plurality of capacitors, a plurality of comparators, a TDC 340, and an output unit 350.

The plurality of resistors may be arranged along the plurality of output lines and the plurality of input lines. For example, the plurality of resistors may be arranged for respective input lines along the output lines. Each of the plurality of resistors may be configured to receive a voltage through an input line in which a resistor 310 is located.

For example, resistors arranged along a $j^{th}$ input line 391 may be configured to receive a $j^{th}$ input voltage signal $b_j$ in response to a start signal. In FIG. 3, input voltage signals $b_1$ through $b_m$ may each have a voltage indicating a binary value. For example, an input voltage signal indicating a bit value of 1 may represent an arbitrary voltage, and an input voltage signal indicating a bit value of 0 may represent a floating voltage. A structure in which the resistors are arranged in an m×n matrix may be referred to as a memory array 390.

The plurality of capacitors may be individually arranged for respective output lines. Each of the plurality of capacitors may be connected to the comparator 330 and the other respective ends of resistors arranged along an output line, among the plurality of output lines, in which the sampling capacitor 320 is located.

Each of the plurality of capacitors may become electrically charged in response to a voltage received through corresponding resistors. For example, the sampling capacitor 320 located in an $i^{th}$ output line 392 may become electrically charged based on the voltage applied to resistors located in the $i^{th}$ output line 392.

In one or more embodiments, the plurality of capacitors may have the same capacitance. This may be due to the plurality of output lines sharing an output of a single global counter, and thus, the output lines may need to have a charge time or a discharge time of the same scale. The charge time and the discharge time may represent a scale proportional to a time constant corresponding to a capacitance and a synthetic resistance value.

The plurality of comparators may be individually arranged for respective output lines. Each of the plurality of comparators may be connected to the sampling capacitor 320 and the other ends of resistors arranged along an output line, among the plurality of output lines, in which the comparator 330 is located.

Each of the plurality of comparators may output a result obtained after comparing a sampling capacitor voltage of the sampling capacitor 320 with a reference voltage. For example, the comparator 330 located in the $i^{th}$ output line 392 may compare a sampling capacitor voltage of the sampling capacitor 320 located in the $i^{th}$ output line 392 with a reference voltage. The comparator 330 located in the $i^{th}$ output line 392 may output an $i^{th}$ count end signal $STOP_i$, in response to a case where the sampling capacitor voltage exceeds the reference voltage.

The TDC 340 may receive count end signals of the output lines, and may convert time information into a digital value. For example, the TDC 340 may output a digital value corresponding to time information individually received for each of n output lines. The TDC 340 may output n digital values corresponding to time information. For example, the TDC 340 may generate $i^{th}$ time information $T_{out,i}$ indicating a time difference between a start time corresponding to a start signal START and an end time corresponding to the $i^{th}$ count end signal $STOP_i$, in response to receiving the $i^{th}$ count end signal $STOP_i$. The $i^{th}$ time information $T_{out,i}$ may be referred to as an $i^{th}$ charge time.

The output unit 350 may output a value mapped to the digital value generated by the TDC 340 as an output value OUTs of each output line. Accordingly, the output unit 350 may output a digital value indicating time information as the output value OUTs indicating a number corresponding to a multiplication accumulated result. For example, a MAC circuit may output the $i^{th}$ output value $OUT_i$ mapped to the $i^{th}$ time information $T_{out,i}$ through a mapping table (e.g., a lookup table). Because an output value is output for each output line, the output unit 350 may output n output values for n output lines.

A single global counter included in the TDC 340 will now be described.

Figure 4:
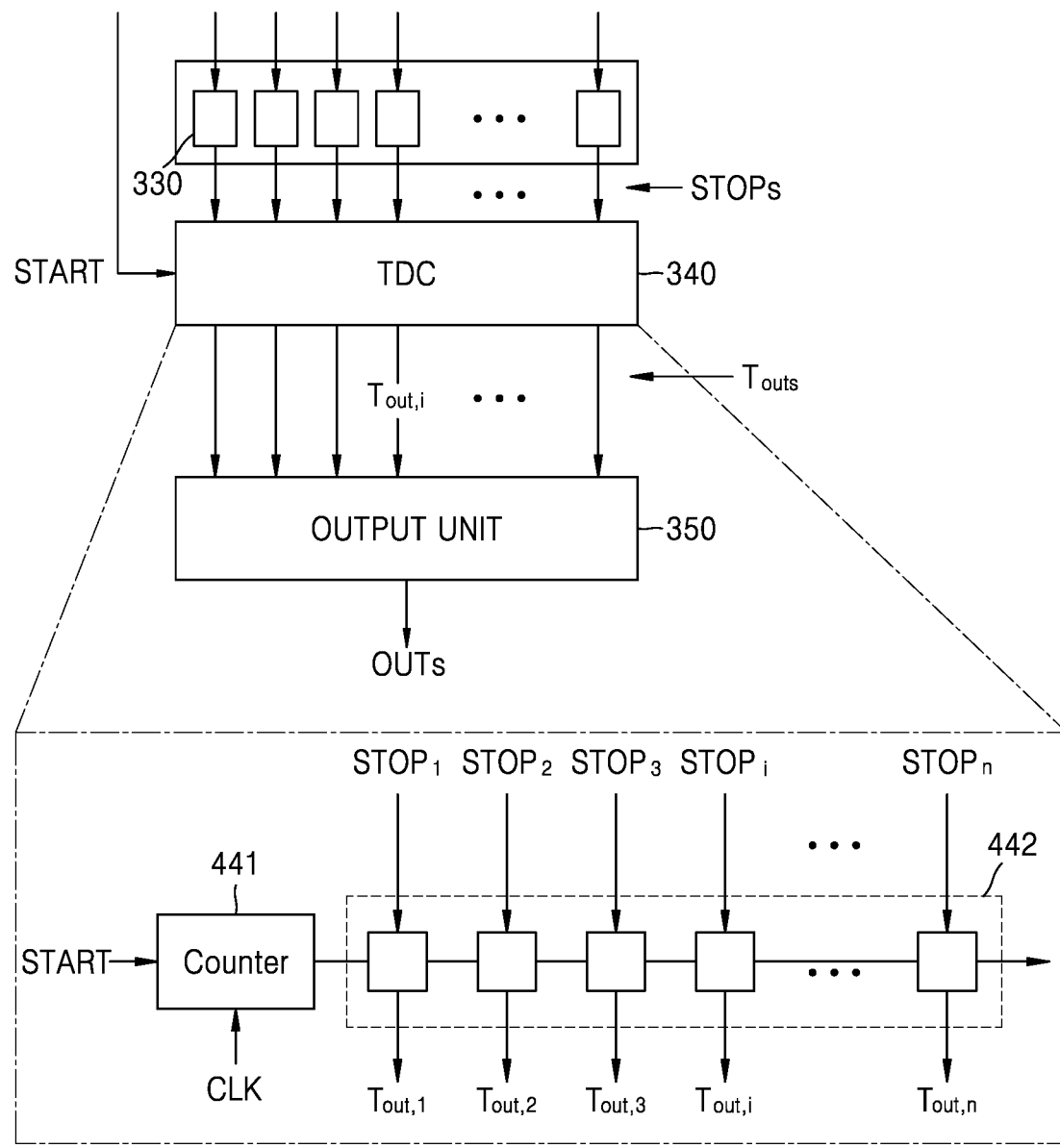
FIG. 4 is a diagram for describing a time-to-digital converter (TDC) according to one or more embodiments.

FIG. 4 is a diagram for describing a TDC according to one or more embodiments.

A configuration of the TDC 340 of FIG. 3 will be further described. The TDC 340 may include a single global counter 441 and a reference unit 442.

The single global counter 441 may output a digital value indicating a time elapsed after a reference time. The single global counter 441 may be connected to comparators of a plurality of output lines. For example, the single global counter 441 may count the number of clocks CLK generated from the reference time. Accordingly, the single global counter 441 may count a time (e.g., a charge time or a discharge time) elapsed from the same reference time for individual output lines in units of clocks, even when there is no additional synchronization operation.

The reference unit 442 may refer to the digital value output by the single global counter 441 at a time when a comparison result is output. The reference unit 442 may include a plurality of hold circuits that refer to a comparison result of the comparators of the plurality of output lines. Each of the plurality of hold circuits may refer to a time when a comparison result is output from a comparator included in a corresponding output line from among the plurality of output lines.

For example, an $i^{th}$ hold circuit corresponding to an $i^{th}$ output line may be connected to an output of an $i^{th}$ comparator. The $i^{th}$ hold circuit may output $i^{th}$ time information $T_{out,i}$, in response to receiving an $i^{th}$ count end signal $STOP_i$ from the $i^{th}$ comparator. For example, each hold circuit may hold the number of clocks CLK counted by the single global counter 441 at an end time when a count end signal is received. The number of clocks CLK held at the end time may correspond to time information (e.g., charge time or discharge time information).

The single global counter 441 may count a reference clock CLK regardless of whether the plurality of hold circuits perform holding, and each of the plurality of hold circuits may operate independently of the other hold circuits. For example, even when a hold circuit holds time information corresponding to a time when a count end signal is received, the single global counter 441 may continuously count clocks CLK independent of the hold circuits.

Figure 5:
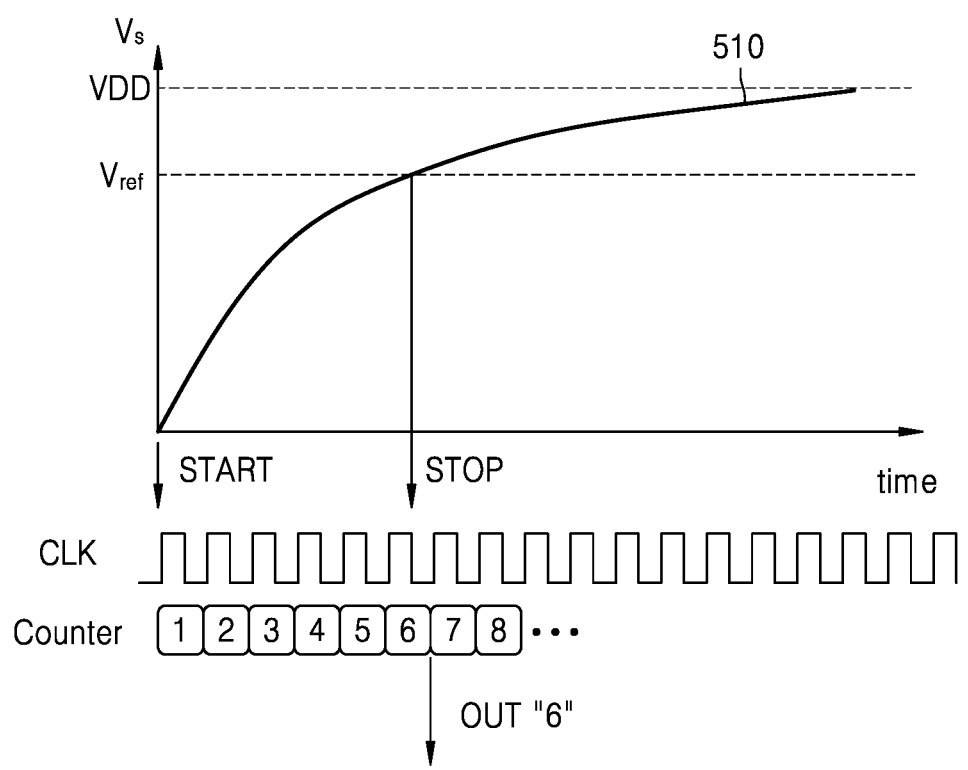
FIG. 5 is a diagram for describing a conversion operation of a TDC according to one or more embodiments.

FIG. 5 is a diagram for describing a conversion operation of a TDC according to one or more embodiments.

A sampling capacitor voltage 510 of a sampling capacitor located in an arbitrary output line may gradually increase according to a natural response corresponding to a time constant as described with reference to FIG. 5. This is because an electric charge is gradually charged in a capacitor.

In an example, a clock generator described with reference to FIG. 4 may generate clocks, and a single global counter may count the number of clocks from a start time START. The single global counter may continuously count the number of clocks even after an end time STOP when the sampling capacitor voltage 510 is equal to a reference voltage $V_{ref}$.

A hold circuit of a reference unit may hold a digital value indicating the number of clocks counted from the start time START to the end time STOP.

For example, in FIG. 5, six clocks may be generated from the start time START to the end time $STOP_i$ and the hold circuit may output a digital value of "6".

Figure 6:
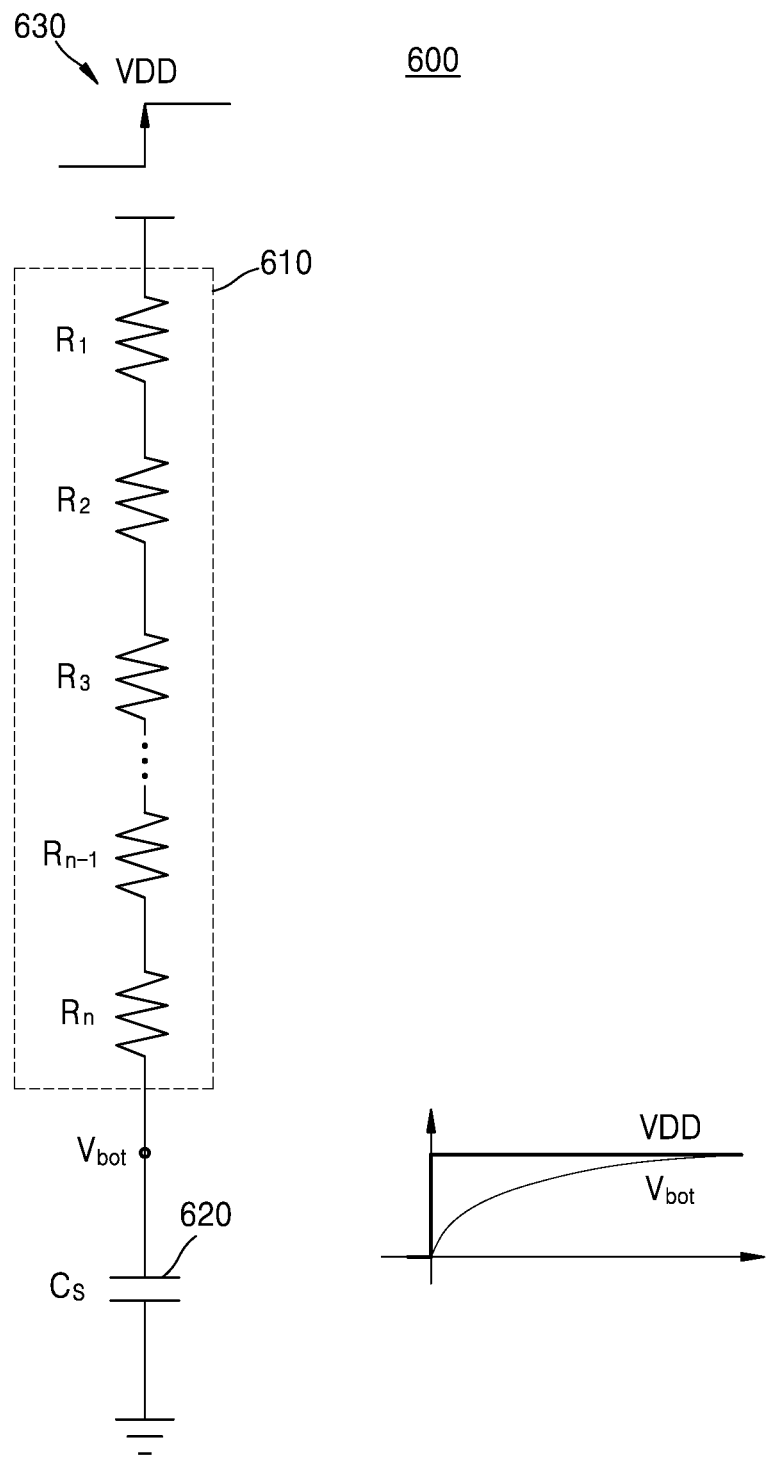
FIG. 6 is a diagram for describing a sampling capacitor voltage measured by a circuit in which a parasitic capacitance does not exist according to one or more embodiments.

FIG. 6 is a diagram for describing a sampling capacitor voltage measured by a circuit in which a parasitic capacitance does not exist according to one or more embodiments.

FIG. 6 illustrates a first circuit 600 in which a parasitic capacitance does not exist. The first circuit 600 may include a resistor group 610 and a sampling capacitor 620.

The resistor group 610 may include a plurality of resistors that are connected in series. One end of the resistor group 610 may be connected to a power supply unit 630 and the other end of the resistor group 610 may be connected to the sampling capacitor 620.

The sampling capacitor 620 may be connected in series to the plurality of resistors included in the resistor group 610. As a DC voltage is applied to the power supply unit 630, the sampling capacitor 620 may become charged. A sampling capacitor voltage $V_{bot}$, a voltage corresponding to the amount of an electric charge charged in the sampling capacitor 620, may change over time based on a time constant determined by a total resistance value of the resistor group 610 and a capacitance of the sampling capacitor 620.

In detail, the sampling capacitor voltage $V_{bot}$ varying with time may be expressed as in Equation 1. When at least some of the plurality of resistors included in the resistor group 610 have different resistance values but total resistance values for the plurality of resistors are the same, the sampling capacitor voltages $V_{bot}$ have the same time constant graph. That is, in both cases where resistors having a large resistance value are located close to the power supply unit 630 and where resistors having a small resistance value are located close to the power supply unit 630, when total resistance values for the plurality of resistors are the same, $\tau_{ideal}$ of Equation 1 is the same, and thus the sampling capacitor voltages $V_{bot}$ have the same graph. This may also be confirmed through Equation 1.

Figure 7A:
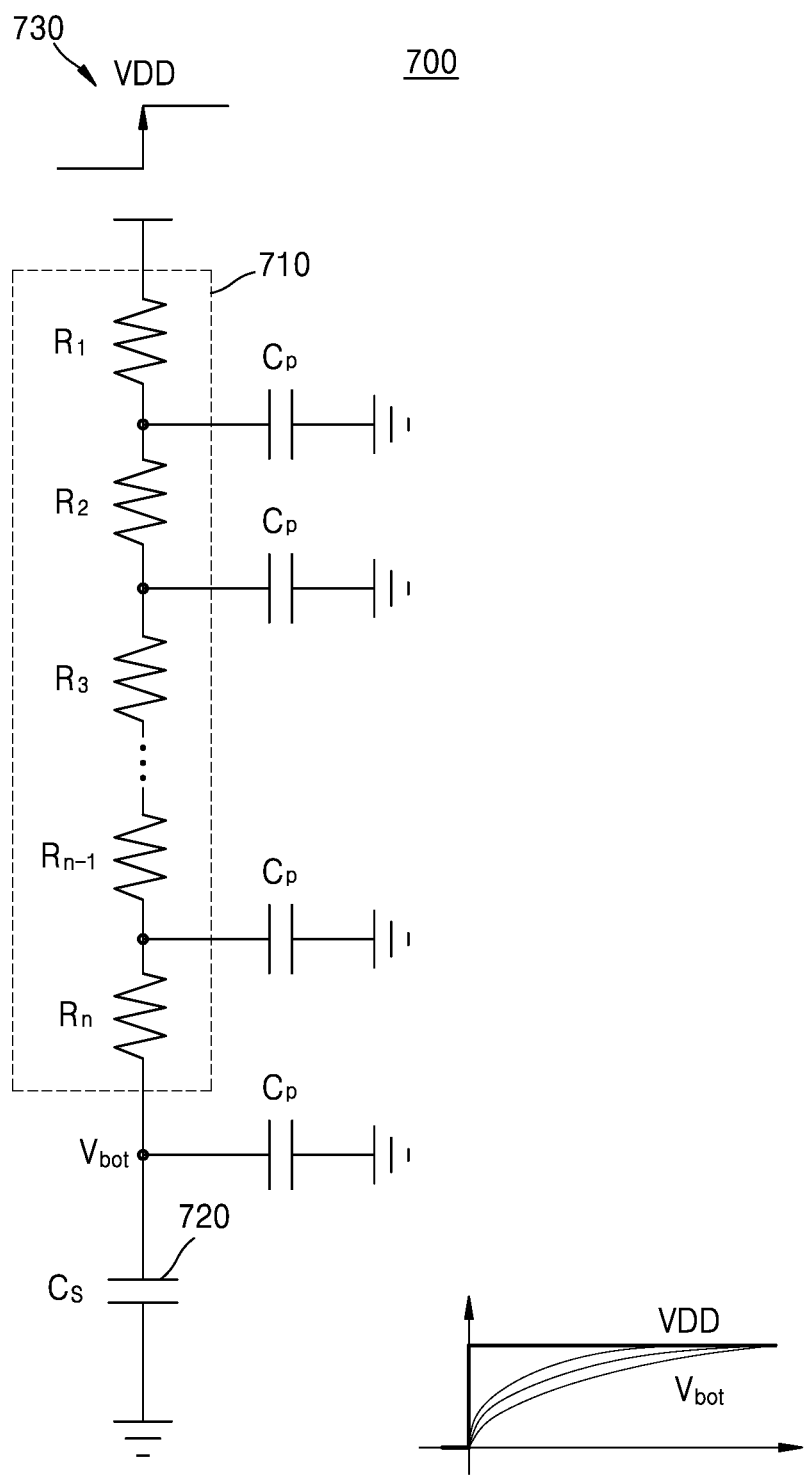
FIGS. 7A and 7B are diagrams for describing a sampling capacitor voltage measured by a circuit in which a parasitic capacitance exists according to one or more embodiments.
Figure 7B:
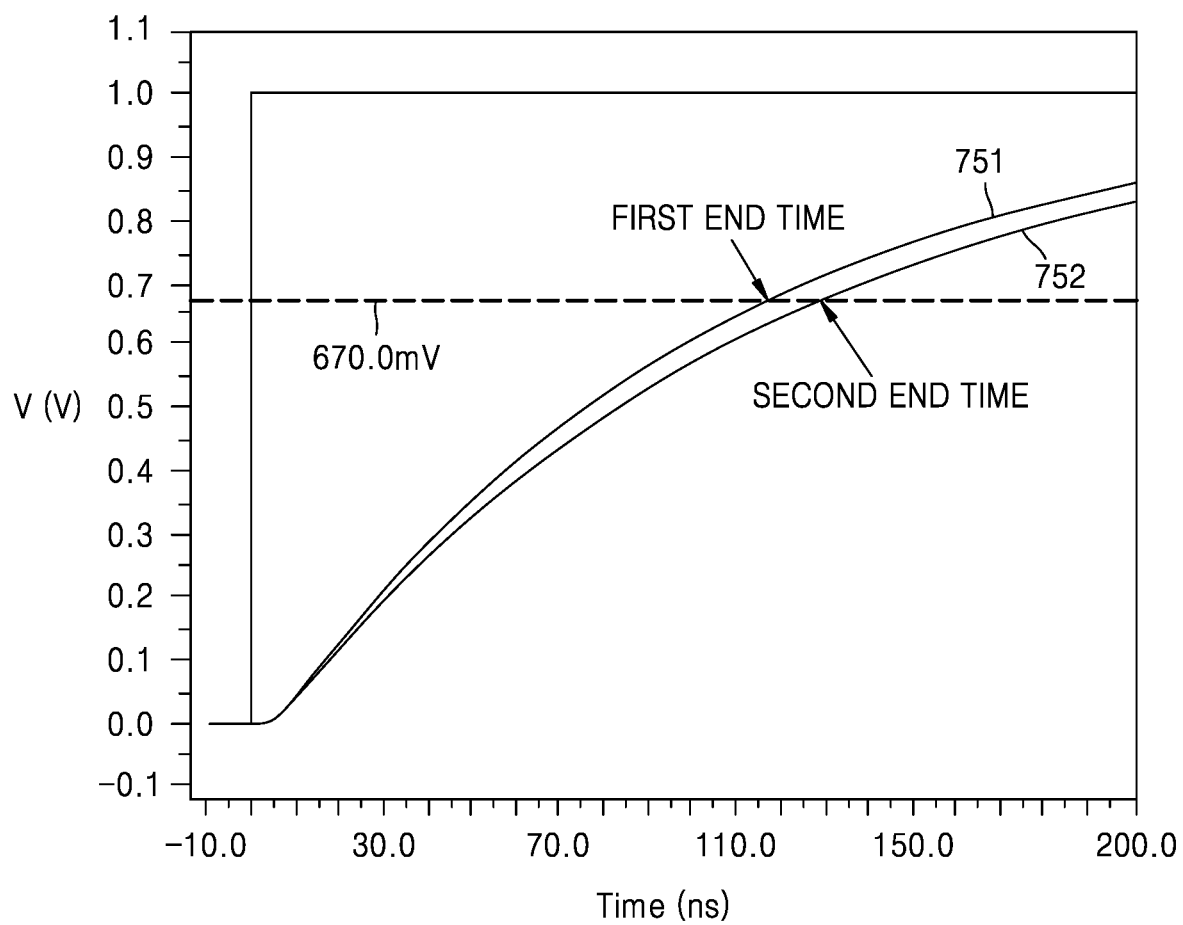

FIGS. 7A and 7B are diagrams for describing a sampling capacitor voltage measured by a circuit in which a parasitic capacitance exists according to one or more embodiments.

FIG. 7A is a diagram illustrating a second circuit 700 in which a parasitic capacitance exists according to one or more embodiments. The second circuit 700 may include a resistor group 710 and a sampling capacitor 720. When compared to the first circuit 600 of FIG. 6, a parasitic capacitance exists in the second circuit 700 of FIG. 7A. A parasitic capacitance exists in a circuit that is actually used, like in the second circuit 700.

Due to the parasitic capacitance existing in the second circuit 700, a sampling capacitor voltage $V_{bot}$ varying with time may be expressed as in Equation 2. Equation 2 is based on an Elmore delay model.

In Equation 2, VDD denotes a DC voltage applied to a power supply unit 730, $C_S$ denotes a capacitance of the sampling capacitor 720, and $R_i$ denotes a plurality of resistors included in the resistor group 710. Also, $C_p$ denotes a parasitic capacitance.

$$V_{bot} = VDD * \left(1 - e^{-\frac{t}{\tau_{real}}}\right) \quad \text{Equation 2}$$

$$\tau_{real} = R_1 C_p + (R_1 + R_2) C_p + (R_1 + R_2 + R_3) C_p + \left(\sum R_i\right)(C_p + C_S)$$
$$= (nR_1 + (n-1)R_2 + \cdots + 2R_{n-1} + R_n) C_p + \left(\sum R_i\right) C_S$$

In Equation 1 and Equation 2, it may be found that the time constant $\tau_{real}$ of the second circuit 700 is different from the time constant $\tau_{ideal}$ of the first circuit 600 due to the influence of the parasitic capacitance $C_P$.

When the total resistance values for the plurality of resistors included in the resistor group 710 are the same but, at least, some of the plurality of resistors have different resistance values, the sampling capacitor voltages $V_{bot}$ may have different graphs.

In further detail, in Equation 2, when total resistance values for the plurality of resistors are the same but resistors having a large resistance value are located close to the power supply unit 730, $\tau_{real}$ increases, and thus a delay of a sampling capacitor voltage graph increases. In contrast, when resistors having a small resistance value are located close to the power supply unit 730, $\tau_{real}$ decreases, and thus a delay of a sampling capacitor voltage graph decreases.

Assuming that total resistance values of a circuit are the same, an error does not occur when delays of sampling capacitor voltage graphs are the same, regardless of whether resistors having a large resistance value are located close to a power supply unit or located close to a sampling capacitor. However, a parasitic capacitance exists in a circuit that is actually used, and the time constant $\tau_{real}$ varies according to whether resistors having a large resistance value are located close to a power supply unit due to the parasitic capacitance. As a result, a delay of a sampling capacitor voltage graph varies, which means that an output error occurs.

FIG. 7B is a diagram describing an output error of a circuit in which a parasitic capacitance exists according to one or more embodiments.

In FIG. 7B, a DC voltage applied to the power supply unit 730 is 1 V, and a reference voltage is set to 0.67 mV. A first resistor and a second resistor are used as resistors of the resistor group 710. It is assumed that a value (Ω) of the first resistor is smaller than a value (Ω) of the second resistor.

A first graph 751 and a second graph 752 show the sampling capacitor voltages $V_{bot}$ measured by different circuits. In detail, the first graph 751 shows a case where 32 first resistors are located and then 32 second resistors are located in a direction from the power supply unit 730 to the sampling capacitor 720. The second graph 752 shows a case where 32 second resistors are located and then 32 first resistors are located in a direction from the power supply unit 730 to the sampling capacitor 720.

In the first graph 751 and the second graph 752, while the total resistance values for a plurality of resistors (32 first resistors and 32 second resistors) included in the resistor group 710 are the same, a delay of the second graph 752 is longer than a delay of the second graph 751. This is because, in this example, when compared to the first graph 751, resistors having a large resistance value are located close to the power supply unit 730 in the second graph 752.

As described with reference to FIGS. 3 through 5, a comparator may output an end signal in response to a case where the sampling capacitor voltage $V_{bot}$ exceeds a reference voltage. Also, a TDC may output a digital value based on a time difference between a start time corresponding to a start signal and an end time corresponding to the end signal, and an output unit may output a multiplication accumulated result corresponding to the digital value as an operation result.

That is, the operation result output from the output unit is determined based on the end time when the sampling capacitor voltage ($V_{bot}$) exceeds the reference voltage. Because a first end time of the first graph 751 and a second end time of the second graph 752 are different from each other, an operation result derived from the first graph 751 is different from an operation result derived from the second graph 752.

Figure 8A:
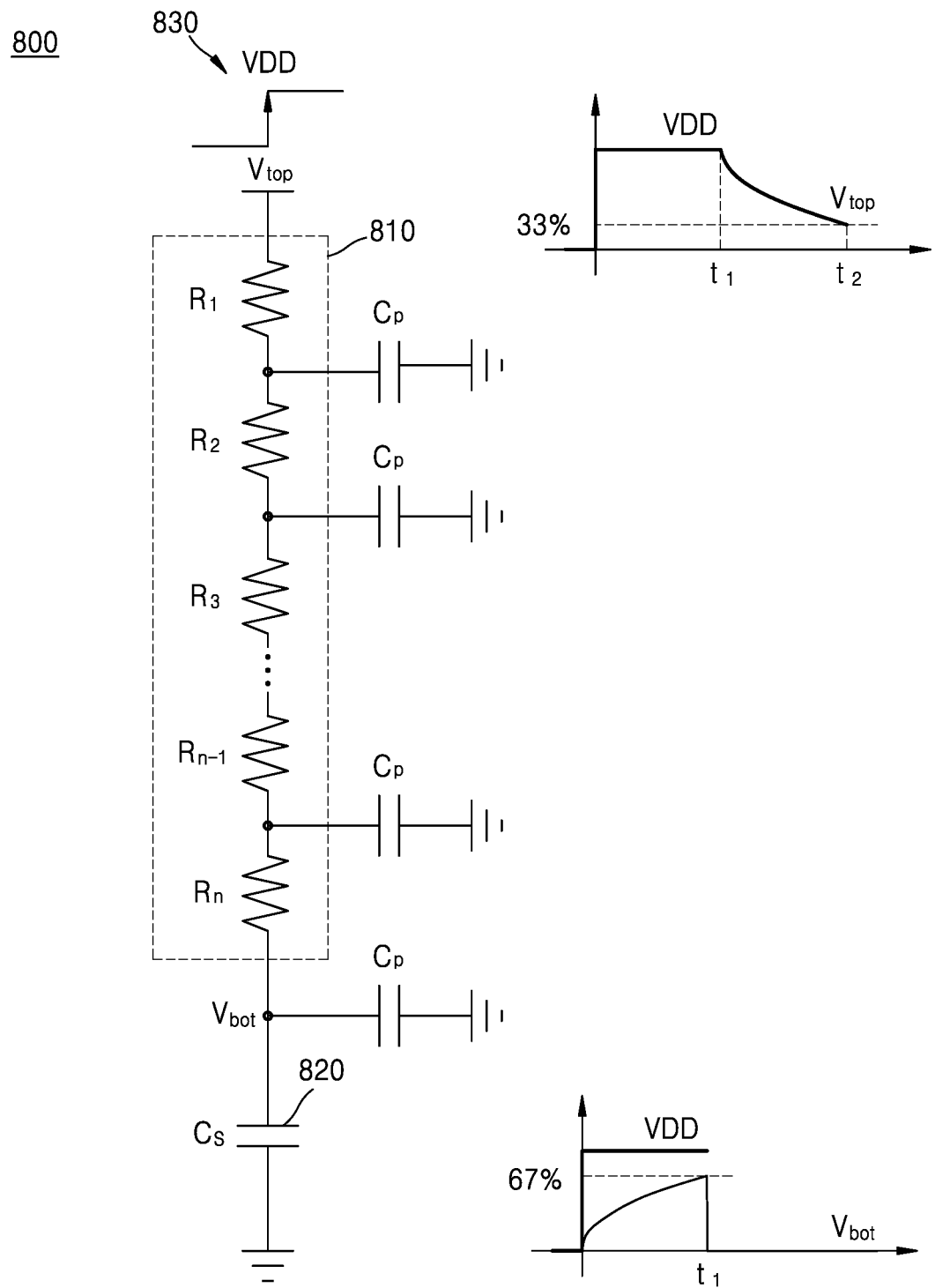
FIGS. 8A and 8B are diagrams for describing a method of performing a predetermined operation using a circuit in which a parasitic capacitance exists according to one or more embodiments.
Figure 8B:
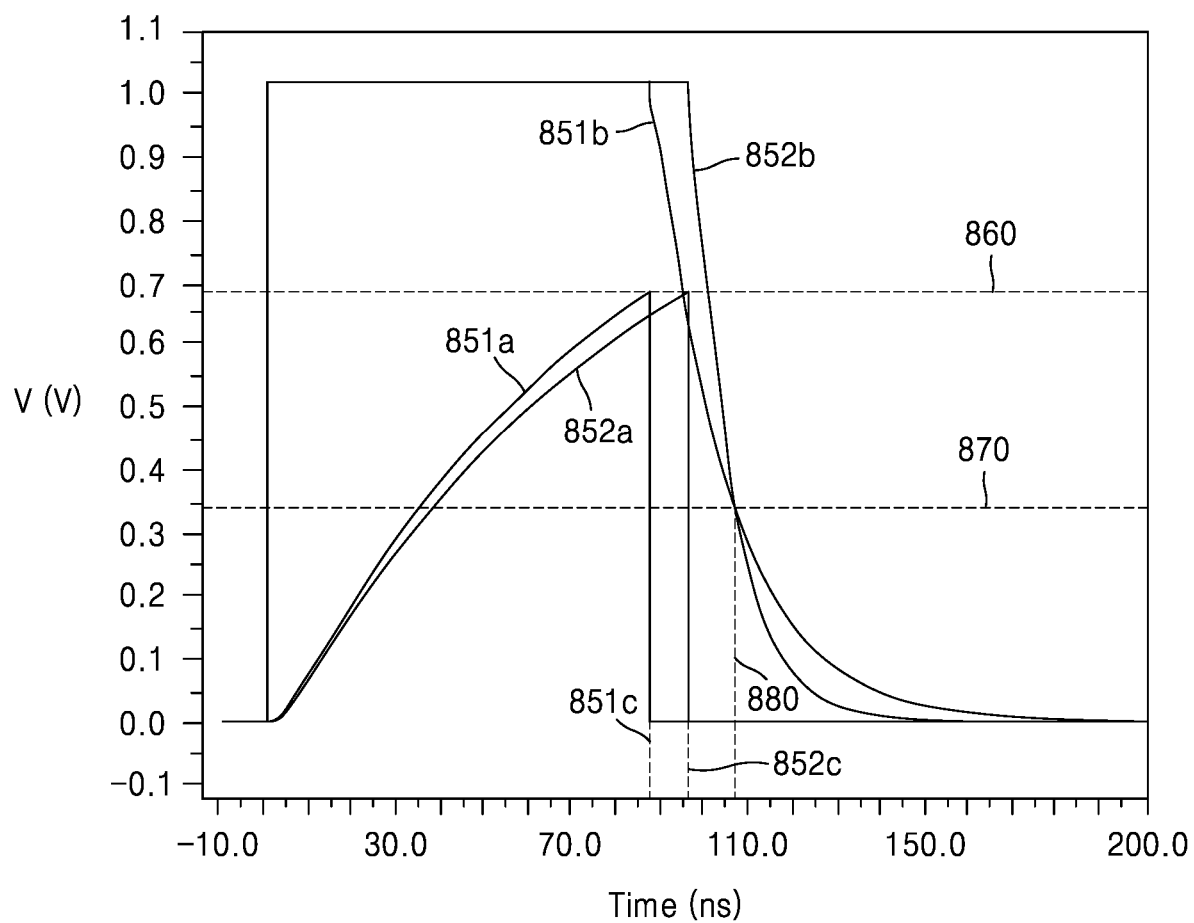

FIGS. 8A and 8B are diagrams for describing a method of performing a predetermined operation using a circuit in which a parasitic capacitance exists according to one or more embodiments.

FIG. 8A illustrates a circuit 800 in which a parasitic capacitance exists according to one or more embodiments. The circuit 800 may include a resistor group 810 and a sampling capacitor 820.

The resistor group 810 includes a plurality of resistors $R_1, \ldots$ and $R_n$ that are connected in series. One end of the resistor group 810 is connected to a power supply unit 830, and the other end of the resistor group 810 is connected to the sampling capacitor 820. Also, a parasitic capacitance $C_P$ exists at each node between the plurality of resistors $R_1 \ldots$, and $R_n$.

After the sampling capacitor 820 is reset, a DC voltage VDD is applied to the power supply unit 830.

In a forward process, a processor may determine a time when a sampling capacitor voltage $V_{bot}$ reaches a first reference voltage as a switching time. The processor may measure the sampling capacitor voltage $V_{bot}$ from the reference time. The reference time may be a time when the DC voltage VDD is applied to the power supply unit 830, or a time elapsed by a predetermined time after the DC voltage VDD is applied.

At the switching time, the processor may connect the sampling capacitor 820 to a ground or a predetermined voltage, and may float the power supply unit 830. For example, although the predetermined voltage may be 1 mV, the predetermined voltage is not limited to a specific value.

As described with reference to FIG. 7A, due to the parasitic capacitance existing in the circuit 800, the sampling capacitor voltage $V_{bot}$ of the forward process may be expressed as Equation 2. Also, a forward delay $\tau_1$ may be expressed as Equation 3.

$$\tau_1 = (nR_1(n-1)R_2 + \ldots + 2R_{n-1} + R_n)C_p + (\Sigma R_i)C_S \quad \text{Equation 3:}$$

In a backward process after the switching time, the processor may determine a time when a power supply unit voltage $V_{top}$ reaches a second reference voltage as an end time. Due to the parasitic capacitance existing in the circuit 800, a backward delay $\tau_2$ for determining the power supply unit voltage $V_{top}$ of the backward process may be expressed as Equation 4.

$$\tau_2 = (nR_n + (n-1)R_{n-1} + \ldots + 2R_2 + R_1)C_p \quad \text{Equation 4:}$$

Equation 5 may be derived by adding the forward delays and the backward delay $\tau_2$.

$$\tau_1 + \tau_2 = ((n+1)R_1 + (n+1)R_2 + \cdots +$$
$$(n+1)R_n)C_p + \left(\sum R_i\right)C_S$$
$$= (n+1)\left(\sum R_i\right)C_p + \left(\sum R_i\right)C_s$$
$$= \left(\sum R_i\right)((n+1)C_p + C_s)$$

Equation 5

In Equation 5, it may be found that, when the forward delay and the backward delay $\tau_2$ are added, a final delay $\tau_1+\tau_2$ is affected only by a total resistance value $\Sigma R_i$, the parasitic capacitance $C_P$, and a sample capacitance $C_S$.

That is, assuming that the parasitic capacitance $C_P$ exists in the circuit 800 and both the forward delay $\tau_1$ and the backward delay $\tau_2$ are used, when at least some of the plurality of resistors included in the resistor group 810 have different resistance values but total resistance values for the plurality of resistors are the same, end times when the power supply unit voltage $V_{top}$ reaches the second reference voltage are the same.

The first reference voltage that is a criterion for determining the switching time may be a value reduced by a predetermined ratio (%) from the DC voltage VDD supplied to the power supply unit 830. Also, the second reference voltage that is a criterion for determining the end time may be a value reduced by '−100—predetermined ratio (%)' from the DC voltage VDD supplied to the power supply unit 830.

For example, when the DC voltage VDD is 1 V and the predetermined ratio (%) is 67%, the first reference voltage may be 0.67 V and the second reference voltage may be 0.33 V. Alternatively, when the DC voltage VDD is 1 V and the predetermined ratio (%) is 50%, the first reference voltage may be 0.5 V and the second reference voltage may be 0.5 V. In particular, when the predetermined ratio (%) is 50%, because the first reference voltage and the second reference voltage have the same value, the switching time and the end time may be determined using only one reference voltage.

The processor may perform a predetermined operation based on the end time. The processor may perform a predetermined operation based on a time required from the reference time to the end time. As described with reference to FIGS. 7A and 7B, the processor may output an operation result based on the required time. In one or more embodiments, the operation result may be a multiplication accumulated result. In another embodiment, the operation result may be a total resistance value of the resistor group 810.

The operation result is determined based on the end time. Assuming that both the forward delay $\tau_1$ and the backward delay $\tau_2$ are used, when at least some of the plurality of resistors included in the resistor group 810 have different resistance values but total resistance values for the plurality of resistors are the same, operation results are the same.

Even when the sample capacitance $C_S$ in Equation 5 is 0, the circuit 800 may operate. In other words, the circuit 800 may perform an operation using only the parasitic capacitance $C_p$, without separately adding the sampling capacitor 820 to the circuit 800. The above description may be expressed as Equation 6.

$$\tau_1+\tau_2=(\Sigma R_i)(n+1)C_p \qquad \text{equation 6:}$$

FIG. 8B is a diagram describing an output error of a circuit in which a parasitic capacitance exists according to one or more embodiments.

In FIG. 8B, a DC voltage applied to the power supply unit 830 is 1 V, a first reference voltage 860 is set to 0.67 mV, and a second reference voltage 870 is set to 0.33 mV. A first resistor and a second resistor are used as resistors of the resistor group 810. It is assumed that a value (Ω) of the first resistor is smaller than a value (Ω) of the second resistor.

A first circuit corresponds to a case of 48 first resistors are located and then 16 second resistors are located in a direction from the power supply unit 830 to the sampling capacitor 820. A second circuit corresponds to a case where 16 second resistors are located and then 48 first resistors are located in a direction from the power supply unit 830 to the sampling capacitor 820.

A $1\text{-}1^{th}$ graph 851a and a $1\text{-}2^{th}$ graph 851b respectively show a forward direction process and a backward direction process performed in the first circuit. The $1\text{-}1^{th}$ graph 851a shows a sampling capacitor voltage $V_{bot}$ varying with time in the forward process performed in the first circuit. The $1\text{-}2^{th}$ graph 851b shows a power supply unit voltage $V_{top}$ varying with time in the backward process performed in the first circuit.

A $2\text{-}1^{th}$ graph 852a and a $2\text{-}2^{th}$ graph 852b respectively show a forward process and a backward process performed in the second circuit. The $2\text{-}1^{th}$ graph 852a shows a sampling capacitor voltage $V_{bot}$ varying with time in the forward process performed in the second circuit. The $2\text{-}2^{th}$ graph 852b shows a power supply unit voltage $V_{top}$ varying with time in the backward process performed in the second circuit.

In the first circuit and the second circuit, total resistance values for a plurality of resistors (48 first resistors and 16 second resistors) included in the resistor group 810 are the same.

In the forward process of the first circuit, a time when the sampling capacitor voltage $V_{bot}$ according to the $1\text{-}1^{th}$ graph 851a reaches the first reference voltage 860 is a first switching time 851c. In the backward process after the first switching time 851c, a time when the power supply unit voltage $V_{top}$ according to the $1\text{-}2^{th}$ graph 851b reaches the second reference voltage 870 is an end time 880.

In the forward process of the second circuit, a time when the sampling capacitor voltage $V_{bot}$ according to the $2\text{-}1^{th}$ graph 852a reaches the first reference voltage 860 is a second switching time 852c. In the backward process after the second switching time 852c, a time when the power supply unit voltage $V_{top}$ according to the $2\text{-}2^{th}$ graph 852b reaches the second reference voltage 870 is the end time 880.

In the forward process, it may be found that a delay of the $2\text{-}1^{th}$ graph 852a is longer than a delay of the $1\text{-}1^{th}$ graph 851a. This is because the $1\text{-}1^{th}$ graph 851a and the $2\text{-}1^{th}$ graph 852a show the sampling capacitor voltages $V_{bot}$, and resistors having a large resistance value are located close to the power supply unit 830 in the $2\text{-}1^{th}$ graph 852a. That is, the $1\text{-}1^{th}$ graph 851a reaches the first reference voltage 860 earlier than the $2\text{-}1^{th}$ graph 852a.

In the backward process, it may be found that a delay of the $2\text{-}2^{th}$ graph 852b is shorter than a delay of the $1\text{-}2^{th}$ graph 851b. This is because the $1\text{-}2^{th}$ graph 851b and the $2\text{-}2^{th}$ graph 852b show the power supply unit voltages $V_{top}$, and resistors having a large resistance value are located close to the sampling capacitor 820 in the $2\text{-}2^{th}$ graph 852b.

However, in both the forward process and the backward process, it may be found that the end times 880 in the first circuit and the second circuit are the same.

Results of operations performed using the first circuit and the second circuit are determined based on the end time 880. Assuming that the forward process and the backward process are performed together, when at least some of the plurality of resistors included in the resistor group 810 have different resistance values but total resistance values for the plurality of resistors are the same, results of operations performed by the first circuit and the second circuit are the same.

Figure 9:
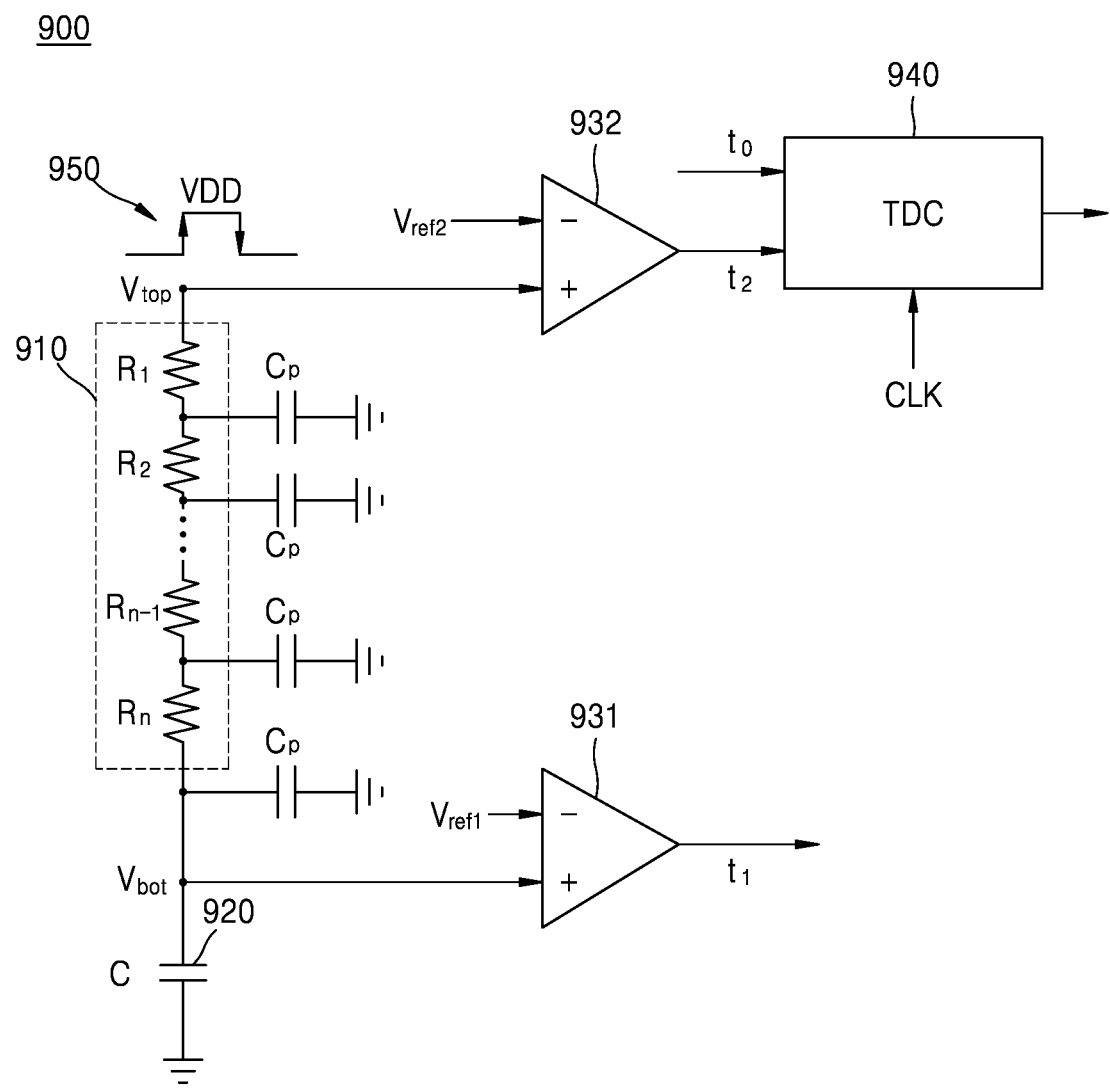
FIG. 9 is a diagram illustrating a circuit for performing a predetermined operation through a forward process and a backward process according to one or more embodiments.

FIG. 9 is a diagram illustrating a circuit for performing a predetermined operation through a forward process and a backward process according to one or more embodiments.

In FIG. 9, a circuit 900 may include a resistor group 910 and a sampling capacitor 920.

The resistor group 910 may include a plurality of resistors $R_1 \ldots$, and $R_n$ that are connected in series. One end of the resistor group 910 may be connected to a power supply unit 950, and the other end of the resistor group 910 may be connected to the sampling capacitor 920. Also, a parasitic capacitance $C_P$ may exist at each node between the plurality of resistors $R_1 \ldots$, and $R_n$.

In one or more embodiments, the circuit 900 may further include a first comparator 931 and a second comparator 932. Each of the first comparator 931 and the second comparator 932 may include an operational amplifier.

The first comparator 931 may output a result obtained after comparing a sampling capacitor voltage $V_{bot}$ with a first reference voltage $V_{ref1}$. The second comparator 932 may output a result obtained after comparing a power supply unit voltage $V_{top}$ with a second reference voltage $V_{ref2}$.

In further detail, after the sampling capacitor 920 is reset, a DC voltage VDD is applied to the power supply unit 950. In a forward process after a reference time $t_0$, the first comparator 931 may output first time information $t_1$ of a time when the sampling capacitor $V_{bot}$ reaches the first reference voltage $V_{ref1}$. The reference time $t_0$ may be a time when the DC voltage VDD is applied to the power supply unit 950, or a time elapsed by a predetermined time after the DC voltage VDD is applied.

When the first time information $t_1$ is output, the sampling capacitor 920 is connected to a ground or predetermined voltage and the power supply unit 950 is floated.

In a backward process, the second comparator 932 may output second time information $t_2$ of a time when a power supply unit voltage $V_{top}$ reaches the second reference voltage $V_{ref2}$.

A TDC 940 may output a digital value based on the reference time $t_0$ and the second time information $t_2$. In detail, the TDC 940 may output a time difference between the reference time $t_0$ and the second time information $t_2$ as a digital value.

An output unit (not shown) may output an operation result mapped to the digital value output by the TDC 940. In one or more embodiments, the operation result may be a multiplication accumulated result. In another embodiment, the operation result may be a total resistance value of the circuit 900.

Although two comparators are used in FIG. 9, because there is a time difference between a time when the sampling capacitor voltage $V_{bot}$ and the first reference voltage $V_{ref1}$ are compared with each other and a time when the power supply unit voltage $V_{top}$ and the second reference voltage $V_{ref2}$ are compared with each other, one comparator may be used.

Figure 10:
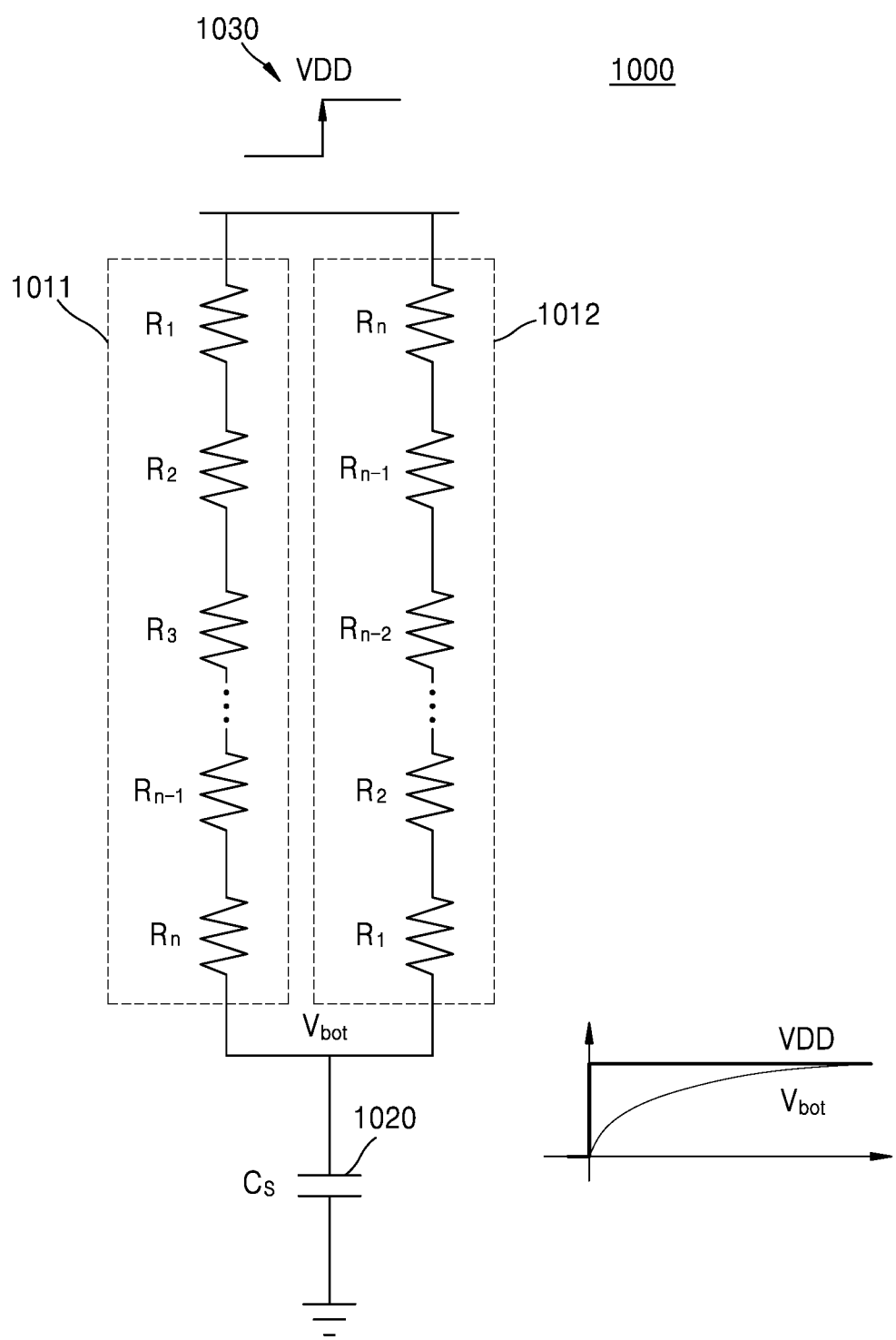
FIG. 10 is a diagram illustrating a circuit for performing a predetermined operation through a forward process according to one or more embodiments.

FIG. 10 is a diagram illustrating a circuit for performing a predetermined operation through a forward process according to one or more embodiments.

FIG. 10 is a diagram illustrating a circuit 1000 in which a parasitic capacitance exists according to one or more embodiments. For convenience of explanation, the parasitic capacitance in the circuit 1000 is not shown in FIG. 10.

The circuit 1000 may include a first resistor group 1011 and a second resistor group 1012. The first resistor group 1011 and the second resistor group 1012 include a plurality of resistors $R_1 \ldots$, and $R_n$ that are connected in series. One end of the first resistor group 1011 and the second resistor group 1012 is connected to a power supply unit 1030, and the other end of the first resistor group 1011 and the second resistor group 1012 is connected to a sampling capacitor 1020. Also, a parasitic capacitance $C_P$ exists at each node between the plurality of resistors $R_1 \ldots$, and $R_n$.

A total resistance value of the first resistor group 1011 is the same as a total resistance value of the second resistor group 1012. However, a resistor arrangement order of the first resistor group 1011 is opposite to a resistor arrangement order of the second resistor group 1012.

In detail, in FIG. 10, in a direction from the power supply unit 1030 to the sampling capacitor 1020, resistors of the first resistor group 1011 are arranged in an order of $R_1$, $R_2, \ldots, R_{n-1}$, and $R_n$, and resistors of the second resistor group 1012 are arranged in an order of $R_n, R_{n-1}, \ldots R_2$, and $R_1$.

A method of performing a predetermined operation using the circuit 1000 of FIG. 10 is as follows.

After the sampling capacitor 1020 is reset, a DC voltage VDD is applied to the power supply unit 1030.

After a reference time, a processor may determine a time when a sampling capacitor voltage $V_{bot}$ reaches the reference voltage as an end time. The reference time may be a time when the DC voltage VDD is applied to the power supply unit 1030, or a time elapsed by a predetermined time after the DC voltage VDD is applied.

The processor may perform a predetermined operation based on the end time. The processor may perform a predetermined operation based on a time required from the reference time $t_0$ the end time. As described with reference to FIGS. 7A and 7B, the processor may output an operation result based on the required time. In one or more embodiments, the operation result may be a multiplication accumulated result. In another embodiment, the operation result may be a total resistance value of the resistor group 1010.

In FIG. 8A, a predetermined operation is performed by performing a forward process and a backward process on the circuit 300. In contrast, in FIG. 10, a predetermined operation may be performed by performing only a forward process, without a backward process, using the first resistor group 1011 and the second resistor group 1012 having opposite resistor arrangement orders.

Figure 11:
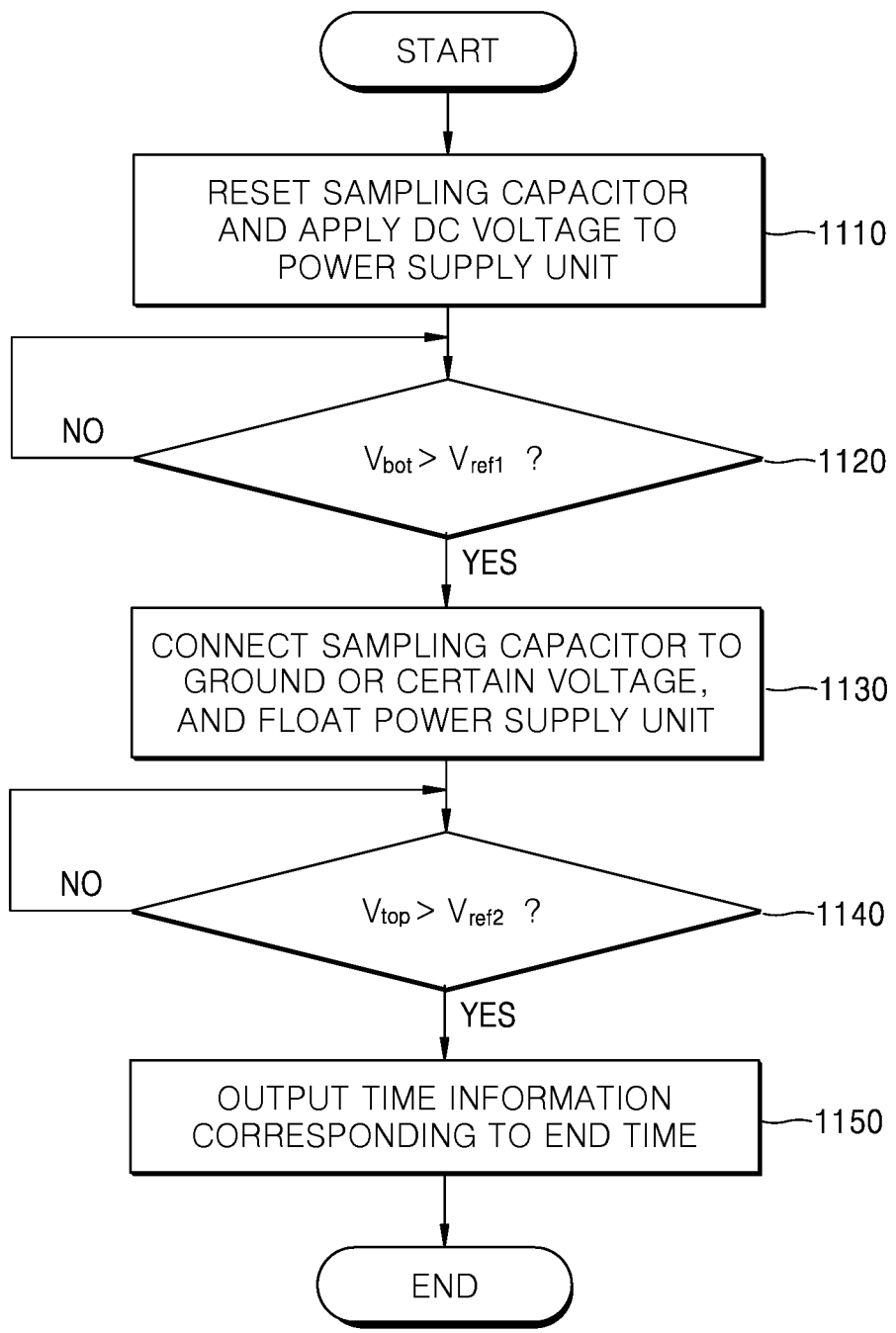
FIG. 11 is a flowchart for describing a method of performing a predetermined operation using a circuit according to one or more embodiments.

FIG. 11 is a flowchart for describing a method of performing a predetermined operation using a circuit according to one or more embodiments.

The circuit may include a resistor group and a sampling capacitor. The resistor group includes a plurality of resistors that are connected in series. One end of the resistor group is connected to a power supply unit, and the other end of the resistor group is connected to the sampling capacitor. Also, a parasitic capacitance exists at each node between the plurality of resistors.

In FIG. 11, in operation 1110, the sampling capacitor is reset, and a DC voltage is applied to the power supply unit.

In operation 1120, a forward process is performed. In detail, in operation 1120, a comparator may compare a sampling capacitor voltage $V_{bot}$ applied to the sampling capacitor with a first reference voltage $V_{ref1}$.

When the sampling capacitor voltage $V_{bot}$ is equal to or less than the first reference voltage $V_{ref1}$, as a result obtained after comparing the sampling capacitor voltage $V_{bot}$ with the first reference voltage $V_{ref1}$, operation 1120 is repeatedly performed.

When the sampling capacitor voltage $V_{bot}$ exceeds the first reference voltage $V_{ref1}$, as a result obtained after comparing the sampling capacitor voltage $V_{bot}$ with the first reference voltage $V_{ref1}$, the method proceeds to operation 1130

In operation 1130, the sampling capacitor is connected to a ground or predetermined voltage, and the power supply unit is floated.

In operation 1140, a backward process is performed. In detail, in operation 1140, the comparator may compare a power supply unit voltage $V_{top}$ applied to the power supply unit with a second reference voltage $V_{ref2}$.

When the power supply unit voltage $V_{top}$ is equal to or greater than the second reference voltage $V_{ref2}$, as a result obtained after comparing the power supply unit voltage $V_{top}$ with the second reference voltage $V_{ref2}$, operation 1140 is repeatedly performed.

When the power supply unit voltage $V_{top}$ is less than the second reference voltage $V_{ref2}$, as a result obtained after comparing the power supply unit voltage $V_{top}$ with the second reference voltage $V_{ref2}$, the method proceeds to operation 1150. A time when the power supply unit voltage $V_{top}$ reaches the second reference voltage $V_{ref2}$ is an end time.

In operation 1150, the comparator may output time information corresponding to the end time.

A processor may perform a predetermined operation based on the time information corresponding to the end time. In one or more embodiments, the processor may perform a MAC operation based on the time information corresponding to the end time. In another embodiment, the processor may calculate a total resistance value of the circuit based on the time information corresponding to the end time.

Figure 12:
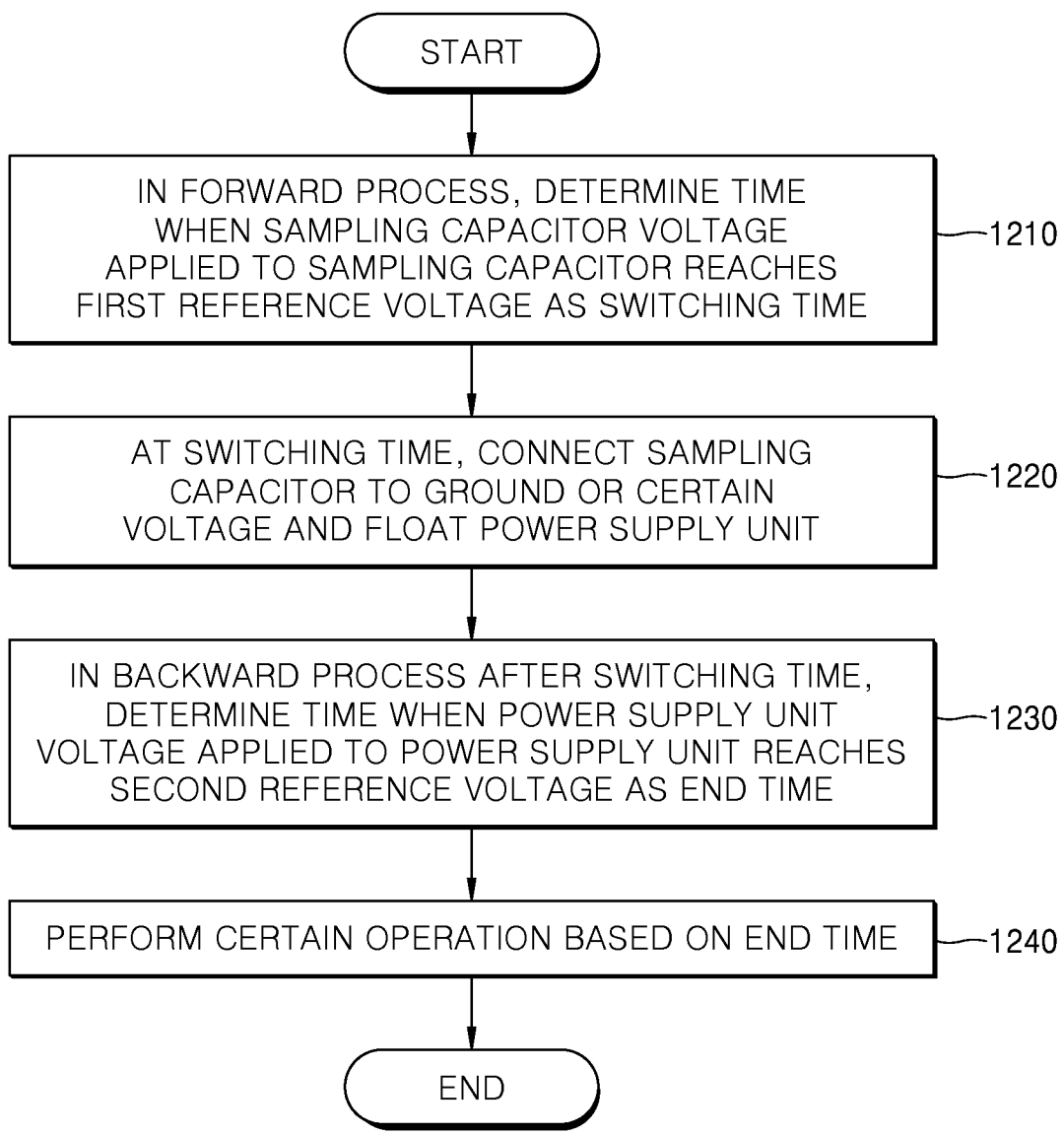
FIG. 12 is a flowchart for describing a method of performing a predetermined operation using a circuit according to one or more embodiments.

FIG. 12 is a flowchart for describing a method of performing a predetermined operation using a circuit according to one or more embodiments.

The circuit may include a resistor group and a sampling capacitor. The resistor group includes a plurality of resistors that are connected in series. One end of the resistor group is connected to a power supply unit, and the other end of the resistor group is connected to the sampling capacitor. Also, a parasitic capacitance exists at each node between the plurality of resistors.

In FIG. 12, in operation 1210, a forward process is performed. In detail, in operation 1210, a processor may determine a time when a sampling capacitor voltage applied to the sampling capacitor reaches a first reference voltage as a switching time.

The processor may measure the sampling capacitor voltage from a reference time. The reference time may be a time when a DC voltage VDD is applied to the power supply unit, or a time elapsed by a predetermined time after the DC voltage VDD is applied.

In operation 1220, at the switching time, the processor may connect the sampling capacitor to a ground or predetermined voltage and may float the power supply unit.

In operation 1230, a backward process is performed. In detail, the processor may determine a time when a power supply unit voltage applied to the power supply unit reaches a second reference voltage as an end time, in the backward process after the switching time.

The first reference voltage of operation 1210 may be a value reduced by a predetermined ratio (%) from the DC voltage supplied to the power supply unit. Also, the second reference voltage of operation 1230 may be a value reduced by '100—the predetermined ratio (%)' from the DC voltage supplied to the power supply unit.

In operation 1240, the processor may perform a predetermined operation based on the end time.

The processor may perform a MAC operation or may calculate a total resistance value of the resistor group, based on the end time.

Assuming that the forward process and the backward process are performed together, when at least some of the plurality of resistors included in the resistor group have different resistance values but total resistance values for the plurality of resistors are the same, operation results are the same.

Figure 13:
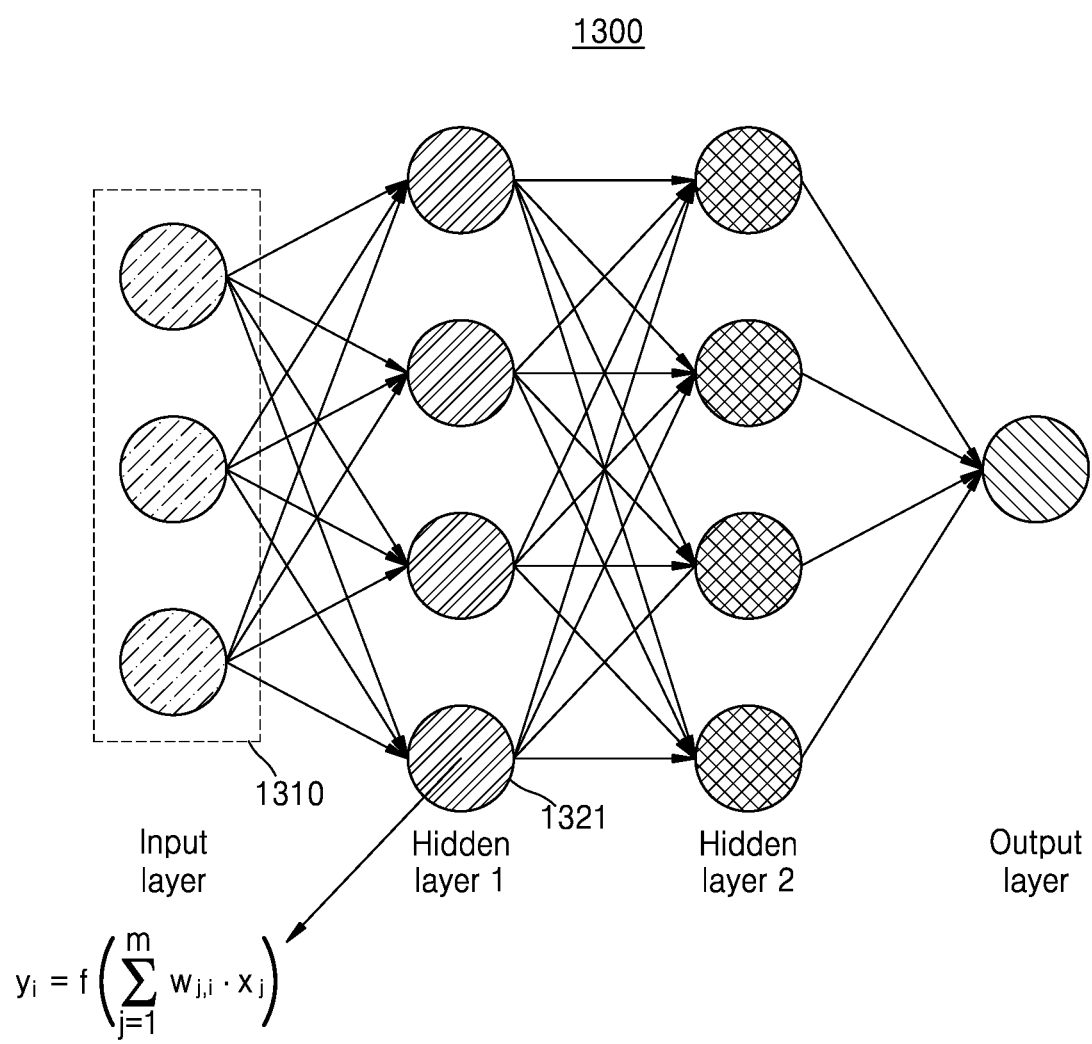
FIG. 13 is a diagram for describing a neural network operation that may be performed using a MAC circuit according to one or more embodiments.

FIG. 13 is a diagram describing a neural network operation that may be performed using a MAC circuit according to one or more embodiments.

A neural network 1300 may correspond to a deep neural network (DNN). The DNN may include a fully connected network, a deep convolutional network, and a recurrent neural network. The neural network 1300 may perform object classification, object recognition, speech recognition, image recognition, etc. by mapping input data and output data having a nonlinear relationship therebetween based on deep learning. The deep learning that is a machine learning method for solving limitations for image or speech recognition from big data sets may map input data and output data through supervised learning or unsupervised learning.

Although hidden layers include two layers for convenience of explanation in FIG. 13, the hidden layers may include any number of layers. Also, although the neural network 1300 includes an input layer 1310 for receiving input data in FIG. 13, the input data may be directly input to the hidden layers. In the neural network 1300, artificial nodes of layers other than an output layer may be connected to artificial nodes of a next layer via links for transmitting an output signal. The number of links may correspond to the number of artificial nodes included in the next layer.

An output of an activation function regarding weighted inputs of artificial nodes included in a previous layer may be input to each artificial node included in the hidden layers. The weighted inputs are obtained by multiplying a weight by an input of the artificial nodes included in the previous layer. The weight may be referred to as a parameter of the neural network 1300. The activation function may include a sigmoid, a hyperbolic tangent (tanh), and a rectified linear unit (ReLU), and non-linearity may be formed in the neural network 1300 due to the activation function. The weighted inputs of the artificial nodes included in the previous layer may be input to each artificial node included in the output layer.

The above-described MAC circuit may be applied to in-memory computing for driving a deep learning algorithm. For example, weighted inputs transmitted between nodes of the neural network 1300 may be calculated using a MAC operation that repeatedly performs multiplication and addition. An output of an arbitrary node (e.g., an $i^{th}$ node 1321) of the neural network 1300 may be expressed as in Equation 7.

$$y_i = f(\Sigma_{j=1}^{m} w_{j,i} x_j) \quad \text{Equation 7:}$$

Equation 7 may represent an output value $y_i$ of the $i^{th}$ node 1321 for m input values in an arbitrary layer. $x_j$ may denote a $j^{th}$ input value (e.g., a node value) of a previous layer, and $w_{j,i}$ may denote the $j^{th}$ input value and a weight applied to the $i^{th}$ node 1321. f( ) may denote an activation function. As shown in Equation 7, a multiplication accumulated result of the node value $x_j$ and the weight $w_{j,i}$ may be used for the activation function. In other words, a memory access operation of loading the node value $x_j$ and the weight $w_{j,i}$ at a desired time and a MAC operation of multiplying and adding the node value $x_j$ and the weight $w_{j,i}$ may be repeatedly performed.

According to one or more embodiments, a plurality of resistors of a MAC circuit may have resistance connected to a connection weight of a connection line for connecting a plurality of nodes, in the neural network 1300 including one or more layers including the plurality of nodes. An input voltage signal provided along input lines in which the plurality of resistors are located may represent a value corresponding to the node value $x_j$. Accordingly, the MAC circuit may perform at least some of operations required to implement the neural network 1300. For reference, resistance values of the resistors in the MAC circuit may not be fixed, and may be changed to a resistance value corresponding to a weight stored in a memory as described above.

However, the application of the MAC circuit according to an embodiment is not limited thereto, and the MAC circuit may also be applied to an operation for rapidly processing a plurality of input data using analog circuit characteristics with low power.

The MAC circuit according to one or more embodiments may have a low power structure combined with an analog adder to digital conversion circuit of an in-memory computing structure using a TDC. As described above, the MAC circuit may calculate a plurality of column data (e.g., data corresponding to output lines) using one TDC, furthermore, a single global counter. This is because a start signal START is synchronized, and thus only a count value corresponding to an end signal STOP may be independently referenced for each column. Accordingly, parallel operations of all arrays in in-memory computing may be covered by one TDC.

In an existing analog-to-digital conversion (ADC) structure, because ADC is required for each individual column and a complex structure is required to increase bit precision, required power and area are large. However, because a TDC structure such as a MAC circuit according to one or more embodiments digitizes an addition value using a simple counter, a circuit is simple. Also, because all array operations are covered by a single TDC, power consumption and size may be reduced.

The embodiments may be implemented as a recording medium including instructions that may be executed in computers, e.g., a program module executed in computers. The computer-readable medium may include any usable medium that may be accessed by computers, volatile and non-volatile media, and separable and non-separable media. Also, the computer-readable medium may include a computer storage medium and a communication medium. Examples of the computer storage medium include all volatile and non-volatile media and separable and non-separable media, which have been implemented by an arbitrary method or technology, for storing information such as computer-readable instructions, data structures, program modules, or other data. The communication medium typically includes computer-readable instructions, a data structure, a program module, other data of a modulated data signal, or another transmission mechanism, and an example thereof includes an arbitrary information transmission medium.

Also, the term "unit" used herein may be a hardware component such as a processor or a circuit and/or a software component executed by a hardware component such as a processor.

While the present disclosure has been particularly shown and described with reference to embodiments thereof, it will be understood by one of ordinary skill in the art that various changes in form and details may be easily made therein without departing from the spirit or essential characteristics of the present disclosure. Hence, it will be understood that the embodiments described above are not limiting of the scope of the present disclosure. For example, each component described in a single type may be executed in a distributed manner, and components described distributed may also be executed in an integrated form.

According to the solution to the technical problems of the present disclosure, an operation error occurring due to a parasitic capacitance existing in a circuit may be reduced.

According to solutions to technical problems of the disclosure, because a forward process and a backward process are sequentially performed in a circuit in which a parasitic capacitance exists, when at least some of a plurality of resistors in the circuit have different resistance values but total resistance values for the plurality of resistors are the same, the same operation result may be obtained.

The circuit 100, 300, 600, 700, 800, 1000, resistor group 110, sampling capacitor 120, 320, power supply unit 150, 730, MAC circuit 300, sampling capacitor 320, comparator 330, TDC 340, output unit 350, single global counter 441, reference unit 442, first circuit 600, resistor group 610, sampling capacitor 620, circuit 800, resistor group 810, and neural network 1300 in FIGS. 1-13 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-13 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of performing a predetermined operation for a circuit that includes a resistor group comprising a plurality of resistors that are connected in series, one end of the resistor group being configured for connection to a power supply unit, the other end of the resistor group being configured for connection to a sampling capacitor, and a parasitic capacitance existing at each node between the plurality of resistors, the method comprising:
   in a forward process, determining a time when a sampling capacitor voltage applied to the sampling capacitor reaches a first reference voltage as a switching time;
   at the switching time, connecting the sampling capacitor to a ground or predetermined voltage and floating the power supply unit;
   in a backward process, after the switching time, determining a time when a power supply unit voltage applied to the power supply unit reaches a second reference voltage as an end time; and
   performing the predetermined operation based on the end time.

2. The method of claim 1, wherein
   the first reference voltage is reduced by a predetermined percentage ratio from a direct current (DC) voltage supplied to the power supply unit, and
   the second reference voltage is reduced by 100 minus the predetermined percentage ratio from the DC voltage supplied to the power supply unit.

3. The method of claim 1, wherein the predetermined operation comprises a multiply-accumulate (MAC) operation or calculating a total resistance value of the resistor group, based on the end time.

4. The method of claim 3, wherein weighted inputs transmitted between nodes of a neural network is determined by the MAC operation.

5. A non-transitory computer-readable storage medium storing instructions that, when executed by one or more processors, configure the one or more processors to perform the method of claim 1.

6. An apparatus for performing a predetermined operation for a circuit, the apparatus comprising:
   a power supply unit connected to one end of the circuit;
   a resistor group comprising a plurality of resistors connected in series between one end of the circuit and another end of the circuit;
   a sampling capacitor connected in series to the plurality of resistors;
   a parasitic capacitance existing at each node between the plurality of resistors;
   a first comparator configured to, in a forward process, compare a sampling capacitor voltage applied to the sampling capacitor with a first reference voltage and output first time information of a time when the sampling capacitor voltage reaches the first reference voltage;
   one or more processors configured to connect the sampling capacitor to a ground or a predetermined voltage, and float the power supply unit when the first time information is output; and
   a second comparator configured to, in a backward process subsequent to the first time information being output, compare a power supply unit voltage applied to the power supply unit with a second reference voltage and output second time information of a time when the power supply unit voltage reaches the second reference voltage,
   wherein the one or more processors are further configured to perform the predetermined operation based on the second time information.

7. The apparatus of claim 6, wherein
   the first reference voltage is reduced by a predetermined percentage ratio from a direct current (DC) voltage supplied to the power supply unit, and
   the second reference voltage is reduced by 100 minus the predetermined percentage ratio from the DC voltage supplied to the power supply unit.

8. The apparatus of claim 6, wherein the predetermined operation is a multiply-accumulate (MAC) operation or calculation of a total resistance value of the resistor group, based on the second time information.

9. The apparatus of claim 8, wherein weighted inputs transmitted between nodes of a neural network is determined by the MAC operation.

* * * * *